(12) United States Patent
Osato

(10) Patent No.: US 10,908,182 B2
(45) Date of Patent: Feb. 2, 2021

(54) ELECTRICAL CONNECTING APPARATUS AND CONTACT

(71) Applicant: KABUSHIKI KAISHA NIHON MICRONICS, Tokyo (JP)

(72) Inventor: Eichi Osato, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 104 days.

(21) Appl. No.: 16/310,940

(22) PCT Filed: Jun. 14, 2017

(86) PCT No.: PCT/JP2017/022015
§ 371 (c)(1),
(2) Date: Dec. 18, 2018

(87) PCT Pub. No.: WO2018/003507
PCT Pub. Date: Jan. 4, 2018

(65) Prior Publication Data
US 2019/0178911 A1   Jun. 13, 2019

(30) Foreign Application Priority Data
Jun. 28, 2016  (JP) ................. 2016-127902

(51) Int. Cl.
*G01R 1/067*   (2006.01)
*G01R 31/26*   (2020.01)
(Continued)

(52) U.S. Cl.
CPC ......... *G01R 1/06727* (2013.01); *G01R 1/067* (2013.01); *G01R 1/073* (2013.01);
(Continued)

(58) Field of Classification Search
CPC .... G01R 1/06727; G01R 1/067; G01R 1/073; G01R 1/07342; G01R 31/26;
(Continued)

(56) References Cited

U.S. PATENT DOCUMENTS 7,952,377 B2 *  5/2011  Kister ................ G01R 1/06733
                                                            324/762.01
2006/0033520 A1   2/2006  Mai
(Continued)

FOREIGN PATENT DOCUMENTS

CN         1900725 A       1/2007
CN       205069945 U       3/2016
(Continued)

OTHER PUBLICATIONS

Tomokazu et al.; Translation of JP4155833B2; Pub. Date Sep. 24, 2008; Translation by EPO & Google (Year: 2008).*
(Continued)

*Primary Examiner* — Nasima Monsur
*Assistant Examiner* — Rahul Maini
(74) *Attorney, Agent, or Firm* — Bacon & Thomas, PLLC

(57) ABSTRACT

An electrical connecting apparatus includes a contact unit provided on a substrate to contact an electrode terminal of a test subject in response to receipt of a load. The contact unit includes multiple plate-like members stacked in the thickness directions of the plate-like members and supported on the substrate in such a manner that a contact surface formed at an end surface of each of the plate-like members contacts a wiring pattern on the substrate. At least some of the multiple plate-like members are contacts including a base, and an arm having one end supported by the base and an opposite end where a tip portion to contact the electrode terminal is formed. The arm has a surface to contact a surface of an adjacent one of the plate-like members to form (Continued)

a conductive path connecting the tip portion and the wiring pattern through the adjacent plate-like member.

18 Claims, 12 Drawing Sheets

(51) Int. Cl.
| | |
|---|---|
| G01R 1/073 | (2006.01) |
| G01R 31/28 | (2006.01) |
| H01R 13/11 | (2006.01) |
| H05K 1/02 | (2006.01) |
| H01R 13/24 | (2006.01) |
| H01R 12/70 | (2011.01) |
| H01R 12/57 | (2011.01) |

(52) U.S. Cl.
CPC ......... *G01R 1/07342* (2013.01); *G01R 31/26* (2013.01); *G01R 31/2863* (2013.01); *H01R 13/113* (2013.01); *H05K 1/0215* (2013.01); *H01R 12/57* (2013.01); *H01R 12/7082* (2013.01); *H01R 13/2442* (2013.01); *H01R 2201/20* (2013.01)

(58) Field of Classification Search
CPC ............ G01R 31/2863; H01R 12/7082; H01R 12/57; H01R 13/113; H01R 13/2442; H01R 2201/20; H05K 1/0215
USPC ........................................ 324/750.01–759.03
See application file for complete search history.

(56) References Cited

U.S. PATENT DOCUMENTS

| | | | |
|---|---|---|---|
| 2007/0257692 A1 | 11/2007 | Yakabe et al. | |
| 2009/0273357 A1 | 11/2009 | Kamata et al. | |

FOREIGN PATENT DOCUMENTS

| | | | | |
|---|---|---|---|---|
| JP | 2002071748 A | 3/2002 | | |
| JP | 2002-531915 A | 9/2002 | | |
| JP | 2002328149 A | 11/2002 | | |
| JP | 2002343520 A | 11/2002 | | |
| JP | 2006-132982 A | 5/2006 | | |
| JP | 2006132982 A | 5/2006 | | |
| JP | 2008032400 A | 2/2008 | | |
| JP | 2008510166 A | 4/2008 | | |
| JP | 4155833 B2 * | 9/2008 | ............ | H01R 33/76 |
| JP | 2015102378 A | 6/2015 | | |
| KR | 1020090115666 | 11/2009 | | |
| KR | 101534828 B1 | 7/2015 | | |
| TW | M523207 U | 6/2016 | | |
| WO | WO00/33089 | 6/2000 | | |

OTHER PUBLICATIONS

Ishimoru; Translation of JP2008032400A; Pub. Date Feb. 14, 2008; Translation by EPO & Google (Year: 2008).*

Tomohisa; Translation of JP2006132982A; Pub. Date May 25, 2006; Translation by EPO & Google (Year: 2006).*

Yoshio; Translation of JP2002328149A; Pub. Date Nov. 15, 2002; Translation by EPO & Google (Year: 2002).*

Translation of International Search Report in PCT/JP2017/0022015 dated Sep. 5, 2017.

First Office Action cited in corresponding Korean Patent Appln. No. 2018-7037294 dated Nov. 28, 2019.

First office action dated Jan. 30, 2020 in corresponding Japanese Appln. No. 2018-525036.

First Office Action dated Jun. 28, 2020 in corresponding Chinese Patent Appln. No. 201780040328.8.

* cited by examiner (A)

(B)

ELECTRICAL CONNECTING APPARATUS AND CONTACT

TECHNICAL FIELD

The present invention relates to an electrical connecting apparatus and a contact, and is applicable to an electrical connecting apparatus including a contact unit to electrically contact an electrode terminal of a packaged integrated circuit (IC).

BACKGROUND ART

In response to size reduction of electronic devices in recent years, IC packages have been required to be reduced in size and thickness. Some IC packages have a plate-like form having a substantially rectangular shape (including a square) in a plan view, include multiple external terminals as electrode terminals provided at a side surface or an edge of a back surface, and include an electrode terminal for ground connection formed of a large pad and provided at a central portion of the back surface.

In a conventional process of manufacturing an integrated circuit, a packaged IC is subjected to a test in terms of electrical characteristics (a package test or a final test, for example). Such a test is conducted using an electrical connecting apparatus for holding an IC to be measured while the IC is attachable and detachable to and from the electrical connecting apparatus, and including contact means to be connected to an electrode terminal of the held IC. The IC fitted to the electrical connecting apparatus is electrically connected to a test equipment (tester) through the electrical connecting apparatus, and is subjected to a test in terms of electrical characteristics.

Patent literature 1 describes an IC socket as an electrical connecting apparatus used for measuring the electrical characteristics of an IC with a large ground (GND) terminal provided at a central portion of the back surface of a package.

The IC to be measured is packaged into a plate-like form having a rectangular shape in a plan view. Multiple external terminals are aligned along a pair of opposing lateral portions of the package. The large GND terminal as an electrode pad for ground connection is provided at the center of the back surface of the package. The IC socket includes a movable contact to contact the external terminals of the IC to be measured, and a GND electrode to contact the GND terminal. The IC socket is supported by a socket cover provided on a substrate. The substrate has a surface where an electrode pattern and a GND pattern are formed. The movable contact is configured to contact the electrode pattern, and the GND electrode is configured to contact the GND pattern.

The GND electrode has an upper surface to contact a surface of the GND terminal of the IC, and a bottom surface contacting the GND pattern on the substrate. In one illustration, the GND electrode is entirely made of a metallic plate (FIG. 2 of patent literature 1). In a different illustration, the GND electrode is entirely made of a conductive sheet having elasticity (FIG. 3 of patent literature 1). In a different illustration, a part of the GND electrode closer to an upper surface is made of a conductive sheet having elasticity, and a part of the GND electrode closer to a bottom surface is made of a metallic plate (FIG. 1 of patent literature 1).

To fit the IC to be measured to the foregoing IC socket, the external terminals of the IC are arranged above a contact point part of the movable contact of the IC socket so as to face the contact point part, and the GND terminal of the IC is arranged above the GND electrode of the IC socket so as to face the GND electrode. In this state, the IC is pressed downwardly to make the external terminals of the IC abut on the contact point part of the movable contact of the IC socket. In this state, the IC is further pressed downwardly to make the movable contact roll to depress the contact point part downwardly, thereby making the GND terminal of the IC abut on the upper surface of the GND electrode of the IC socket. The IC is pressed and held so as to maintain this abutment, thereby fitting the IC to the IC socket.

PRIOR ART LITERATURE

Patent Literature

Patent Literature 1: Japanese Patent Application Publication No. 2002-328149

SUMMARY OF INVENTION

Problem to be Solved by Invention

In the case of an IC package having a small thickness responsive to a recent trend toward thickness reduction of IC packages, pressing the IC package under high pressing load may expose the IC package to risk such as damage. Hence, reducing the load of pressing the IC package is desired.

Meanwhile, if the GND terminal of the IC is in surface contact with the upper surface of the GND electrode of the IC socket and in this state, if the GND terminal of the IC is pressed from a direction vertical to the contact surface like in the case of the IC socket described in patent literature 1, reducing pressing load makes it likely that the GND terminal of the IC and the GND electrode of the IC socket will not contact each other stably. The contact therebetween may become insufficient by the presence of a foreign matter adhering to the GND terminal of the IC or the GND electrode of the IC socket, formation of an oxide coating film on the GND terminal of the IC or the GND electrode of the IC socket, or the occurrence of distortion at the package or the GND terminal, for example.

A different problem may also arise that, if many ICs are to be tested using a single IC socket, cleaning for removing foreign matters from the upper surface of the GND electrode of the IC socket should be done more frequently.

A different problem may also arise that, if a conductive sheet having elasticity is used for forming the GND electrode, the conductive sheet is inferior to a metallic material in resistance to heat or durability.

Thus, an electrical connecting apparatus and a contact are strongly desired to achieve stable electrical contact with an electrode pad for ground connection while reducing load of pressing an IC package when an integrated circuit as a test subject is tested in terms of electrical characteristics.

Means of Solving Problem

To solve the foregoing problems, an electrical connecting apparatus according to a first aspect of the present invention comprises a contact unit provided on a substrate and to contact an electrode terminal of a test subject in response to receipt of load and to be electrically connected to the electrode terminal. The contact unit includes multiple plate-like members having conductivity. The plate-like members are stacked in the thickness directions of the plate-like members. The plate-like members are supported on the substrate in such a manner that a contact surface formed at an end surface of each of the plate-like members contacts a wiring pattern formed on the substrate. At least some of the multiple plate-like members are contacts each including a base with the contact surface, and an arm having one end supported by the base and an opposite end where a tip portion to contact the electrode terminal of the test subject is formed. The arm has a surface to contact a surface of an adjacent one of the plate-like members to form a conductive path connecting the tip portion and the wiring pattern through the adjacent plate-like member.

A contact according to a second aspect of the present invention is a plate-like contact supported on a substrate and forming a contact unit to contact an electrode terminal of a test subject in response to receipt of load and to be electrically connected to the electrode terminal. The contact comprises: a base with a contact surface contacting a wiring pattern formed on the substrate; an arm having one end supported by the base and an opposite end where a tip portion to contact the electrode terminal of the test subject is formed; and a stopper to regulate movement of the tip portion when the electrode terminal of the test subject abuts on the tip portion to apply the load to the tip portion.

Advantageous Effects of Invention

The present invention is capable of providing an electrical connecting apparatus and a contact to achieve stable electrical contact with a GND terminal while reducing load of pressing an IC package when an integrated circuit as a test subject is tested in terms of electrical characteristics.

Figure 1:
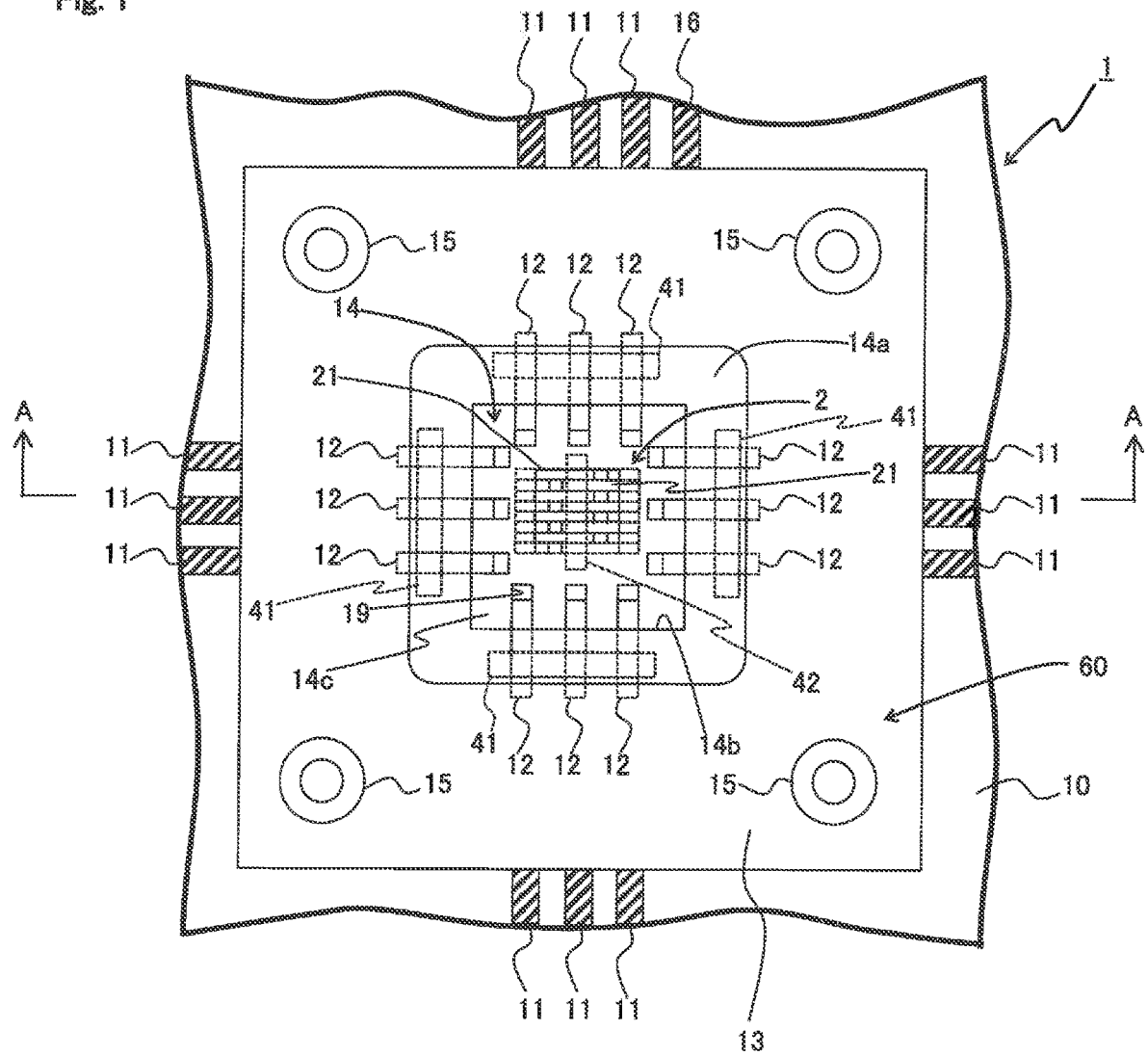
FIG. 1 is a configuration view showing the configuration of an electrical connecting apparatus according to a first embodiment.

EMBODIMENT FOR CARRYING OUT INVENTION (A) First Embodiment

A first embodiment of an electrical connecting apparatus and a contact according to the present invention will be described in detail below by referring to the drawings.

(A-1) Configuration of First Embodiment

Figure 2:
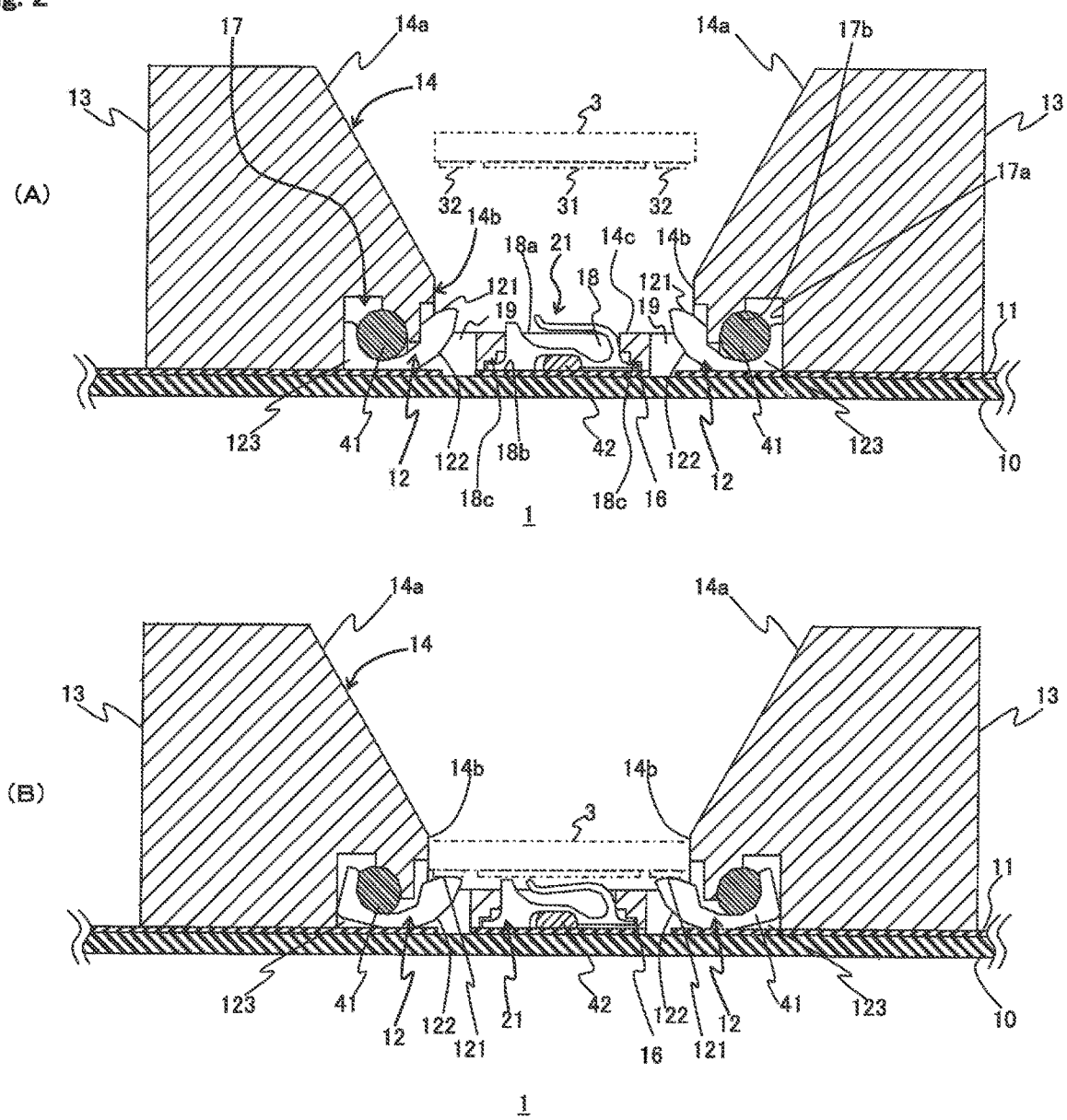
FIG. 2 is a sectional view taken along a line A-A with arrows in FIG. 1.
Figure 3:
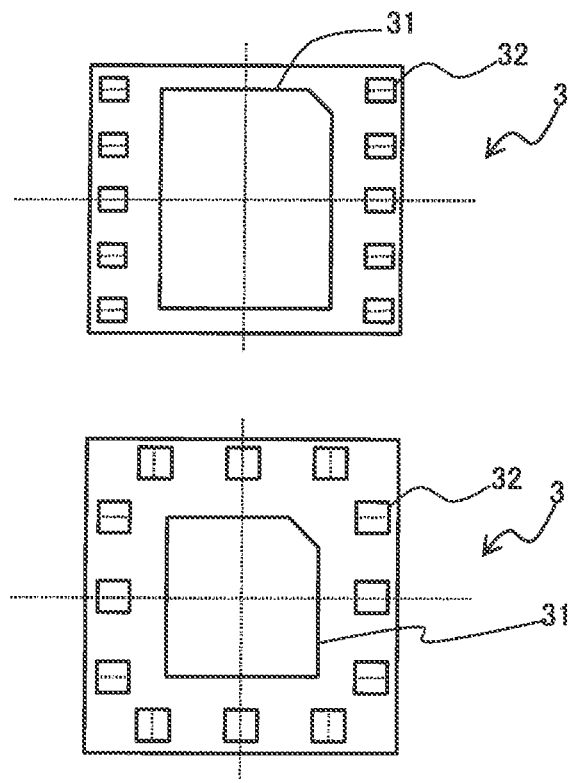
FIG. 3 shows an example of the configuration of the back surface (bottom surface) of an integrated circuit as a test subject according to the first embodiment.

FIG. 1 is a configuration view showing the configuration of an electrical connecting apparatus according to a first embodiment. FIG. 2 is a sectional view taken along a line A-A with arrows in FIG. 1. FIG. 3 shows an example of the configuration of the back surface (bottom surface) of an integrated circuit as a test subject according to the first embodiment.

As shown in FIG. 3(A) and FIG. 3(B), an integrated circuit 3 (hereinafter also called an IC) as a test subject is a semiconductor device packaged into a form like a thin plate having a substantially rectangular shape in a plan view (in the below, unless otherwise specified, a rectangular shape includes a square). The size of the integrated circuit 3 is not particularly limited. For example, the integrated circuit 3 may have a package length and a package width of about 3 mm or less, and the height of a package body (thickness) may be about 1 mm or less.

The integrated circuit 3 shown in FIG. 3(A) and FIG. 3(B) is a surface mounting type leadless package. The integrated circuit 3 includes a ground terminal 31 (hereinafter also called a GND terminal) as a large electrode terminal like a pad for grounding provided at a central portion of the back surface of the integrated circuit 3, and multiple external terminals 32 around the GND terminal 31 as small electrode terminals like pads to fulfill various types of functions such as input and output of signals, power supply, and grounding.

The GND terminal 31 has a contact surface like a flat surface having a larger area than the external terminal 32. The GND terminal 31 may be a die pad exposed at the back surface of the IC package, for example, and may further function to dissipate heat. A package with the large GND terminal 31 is suitably applied to an integrated circuit such as a semiconductor device for communication, for example, in which importance is attached to ground characteristics.

The external terminal 32 has a contact surface like a flat surface having a smaller area than the GND terminal 31. Multiple external terminals 32 are arranged in a line at predetermined intervals along the margins of the back surface of the integrated circuit 3. As shown in FIG. 3(A), for example, the multiple external terminals 32 may be arranged along the edges of two opposing sides out of the edges of the four sides of the back surface of the integrated circuit 3. As shown in FIG. 3(B), the multiple external terminals 32 may alternatively be arranged along all the edges of the four sides of the back surface of the integrated circuit 3.

In the illustrations of FIG. 3(A) and FIG. 3(B), the multiple external terminals 32 have respective contact surfaces exposed at the bottom surface of the integrated circuit 3. Alternatively, each of the external terminals 32 may have an L-shaped exposed contact surface extending from a side surface to the bottom surface of the integrated circuit 3.

In a case described as an example in the first embodiment, the integrated circuit 3 to be housed in an electrical connecting apparatus 1 shown in FIG. 1 includes three external terminals 32 arranged along the edge of each of the four sides, and one GND terminal 31 arranged at the central portion as shown in FIG. 3(B). As will be described later, the electrical connecting apparatus 1 includes multiple contacts 12 (hereinafter also called external terminal contacts) provided at positions responsive to the positions of corresponding ones of the external terminals 32 of the integrated circuit 3 housed in the electrical connecting apparatus 1 and to electrically contact the corresponding external terminals 32. The electrical connecting apparatus 1 further includes a contact unit 2 (hereinafter also called a ground terminal contact unit or a GND terminal contact unit) provided at a position responsive to the position of the GND terminal 31 of the integrated circuit 3 housed in the electrical connecting apparatus 1 and to electrically contact the GND terminal 31.

Referring to FIG. 1, the electrical connecting apparatus 1 according to the first embodiment includes a substrate 10 and a socket unit 60 provided on the substrate 10. The socket unit 60 includes: the multiple external terminal contacts 12 to electrically contact corresponding ones of the external terminals 32 of the integrated circuit 3 (see FIG. 3); the GND terminal contact unit 2 to electrically contact the GND terminal 31 of the integrated circuit 3; a housing 13 in which the external terminal contacts 12 and the GND terminal contact unit 2 are assembled; a first holding part 41 for attaching the multiple external terminal contacts 12 to the housing 13; and a second holding part 42 for attaching the GND terminal contact unit 2 to the housing 13. The electrical connecting apparatus 1 may include multiple socket units 60 provided on one substrate 10.

The electrical connecting apparatus 1 is an apparatus to be connected to an unillustrated test equipment (tester) for receiving and transmitting signals necessary for conducting a test, to house the integrated circuit 3 as a test subject (see FIG. 3) while the integrated circuit 3 is attachable and detachable to and from the electrical connecting apparatus 1, and to test the integrated circuit 3 in terms of electrical characteristics. For example, the electrical connecting apparatus 1 is used as a testing IC socket to be used in an electrical test (a package test or a final test, for example) of an IC having been assembled in a manufacturing process.

The electrical connecting apparatus 1 houses the integrated circuit 3 as a test subject in an opening part 14 at a central portion of the housing 13 (see FIG. 2(A) and FIG. 2(B)). To stabilize electrical contact of each external terminal contact 12 with a corresponding one of the external terminals 32 of the integrated circuit 3 and electrical contact of the GND terminal contact unit 2 with the GND terminal 31 of the integrated circuit 3, the integrated circuit 3 is pressed downwardly under predetermined pressing load by unillustrated means, specifically, the integrated circuit 3 is pressed toward the substrate 10 from above the opening part 14, thereby fitting the integrated circuit 3 to the electrical connecting apparatus 1.

The substrate 10 is a wiring board made of an electrically insulating member, for example. The substrate 10 has a surface on which a wiring pattern made of a metallic material having conductivity is formed by printed wiring technique, for example. The housing 13 is fixed to the surface of the substrate 10 with the wiring pattern from above using fixing members 15 such as screws, for example. The wiring pattern includes multiple first conductive parts 11 contacting corresponding ones of the multiple external terminal contacts 12, and a second conductive part 16 contacting the GND terminal contact unit 2.

As shown in FIG. 2(A) and FIG. 2(B), the first conductive parts 11 are multiple strip-shaped patterns formed at positions responsive to the positions of corresponding ones of the external terminal contacts 12 to electrically contact corresponding ones of the external terminals 32 of the integrated circuit 3. Specifically, each of the first conductive parts 11 is formed under the corresponding external terminal contact 12 to contact a lower portion of the corresponding external terminal 32 and to be electrically connected to this external terminal 32. Each of the first conductive parts 11 extends beyond the housing 13 to be connected to a wiring pattern leading to the test equipment. As shown in FIG. 1, in this embodiment, three first conductive parts 11 extend beyond the housing 13 from each side of the housing 13 while being aligned at predetermined intervals.

As shown in FIGS. 2(A) and 2(B), the second conductive part 16 is a pattern formed at a position responsive to the position of the GND terminal contact unit 2 to electrically contact the GND terminal 31 of the integrated circuit 3. Specifically, the second conductive part 16 is formed under the GND terminal contact unit 2 so as to contact the lower surface of the GND terminal contact unit 2 and to be electrically connected to the GND terminal contact unit 2. In this embodiment, the second conductive part 16 has a portion of a substantially rectangular shape conforming to the size of the outer shape of the GND terminal contact unit 2, so that the second conductive part 16 is formed to be capable of contacting the lower surface of the GND terminal contact unit 2 in a large area. The second conductive part 16 is connected to a wiring pattern leading to the ground side. As shown in FIG. 1, in this embodiment, one second conductive part extends beyond the housing 13 from one side of the housing 13.

The housing 13 is made of an electrically insulating material. The housing 13 includes the opening part 14 as a recess having a rectangular opening provided at a central portion of the housing 13 for housing the integrated circuit 3 as a test subject. A recess 17 for housing the multiple external terminal contacts 12 is provided around the opening part 14 and on each side of the opening part 14. The opening part 14 has a bottom surface 14c provided with a hole part 18 for housing the GND terminal contact unit 2, and a slit 19 for housing the tip side of each external terminal contact 12.

The opening part 14 of the housing 13 has an inner surface including the bottom surface 14c and a side surface. To allow the integrated circuit 3 to be fitted easily, an upper area of the side surface is formed into a tilted surface 14a tilted so as to be tapered toward the bottom. Specifically, the tilted surfaces 14a are formed at the respective upper areas of the four side surfaces of the opening part 14. To determine the position of the housed integrated circuit 3 reliably, a housing wall surface 14b vertical to the substrate 10 is formed in a lower area of each of the four side surfaces of the opening part 14, specifically, below a corresponding one of the tilted surfaces 14a.

The recess 17 at the housing 13 extends lateral to and along each of the four sides of the bottom surface 14c of the opening part 14, and is opened downwardly. The recess 17 has a back surface 17a formed at the bottom of the inner surface of the recess 17 and contacting the rear end of the external terminal contact 12 housed in the recess 17, and an arc surface 17b formed at the upper corner of the front side of the inner surface of the recess 17 and contacting a side surface of the first holding part 41 housed in the recess 17.

The hole part 18 at the housing 13 is a hole located below the opening part 14 and communicating with the opening part 14. The hole part 18 penetrates the central portion of the housing 13. The hole part 18 has an upper opening 18a having a substantially rectangular shape, formed at a central portion of the bottom surface 14c of the opening part 14, and from which an upper portion of the GND terminal contact unit 2 projects. The hole part 18 further has a lower opening 18b having a substantially rectangular shape, formed at a central portion of the back surface of the housing 13, and from which the lower surface of the GND terminal contact unit 2 is exposed. The hole part 18 has an inner surface provided with a latching part 18c as a step for latching the GND terminal contact unit 2. The latching part 18c is provided at a pair of opposing inner walls of the hole part 18.

The slit 19 at the housing 13 communicates with the recess 17 and extends inwardly from the housing wall surface 14b of the opening part 14 and vertically to the housing wall surface 14b. The slit 19 is opened while extending from the housing wall surface 14b to the bottom surface 14c of the opening part 14, and is opened at the back surface of the housing 13. The slit 19 is located around the hole part 18.

Each external terminal contact 12 is made of a metallic member having conductivity. As shown in FIG. 2, the external terminal contact 12 is a substantially U-shaped plate-like member. As shown in FIG. 2, each external terminal contact 12 includes: a contact part 121 having a contact surface at a tip to electrically contact a corresponding one of the external terminals 32 of the integrated circuit 3; a support part 123 fixating a rear end part of the external terminal contact 12 and caught by the first holding part 41 and the back surface 17a of the recess 17; and an arc-shaped part 122 connecting the contact part 121 and the support part 123 and contacting a corresponding one of the first conductive parts 11 on the substrate 10.

The first holding part 41 is formed into a columnar shape using an electrically insulating material having elasticity such as silicone rubber. The first holding part 41 is a member located over each external terminal contact 12, and supporting each external terminal contact 12 in a manner that allows rolling of each external terminal contact 12 by abutting on the upper inner surface of each external terminal contact 12 curved into an arc-like shape.

The arc-shaped part 122 of each external terminal contact 12 has a contact surface at an external (lower) surface 12 contacting a corresponding one of the first conductive parts 11. This contact surface is curved into a projecting arc-like shape in order to allow each external terminal contact 12 itself to roll when the housed integrated circuit 3 is pressed under predetermined pressing load to depress the contact part 121 of the external terminal contact 12.

The inner surface of the arc-shaped part 122 and the inner surface of the support part 123 at which the external terminal contact 12 is housed in the recess 17 are curved into a recessed arc-like shape so as to contact the outer surface of the first holding part 41.

With the external terminal contact 12 assembled in the electrical connecting apparatus 1, the contact part 121 projects upwardly from the slit 19, the tip side of the arc-shaped part 122 is housed in the slit 19, and the rear end side of the arc-shaped part 122 and the support part 123 are housed in the recess 17. The first holding part 41 is arranged at the upper corner of the front side of the recess 17. The side surface of the first holding part 41 contacts the arc surface 17b of the recess 17 and the respective inner side surfaces of the multiple external terminal contacts 12. In this configuration, the first holding part 41 presses the outer surfaces of the support parts 123 of the multiple external terminal contacts 12 against the back surface 17a of the recess 17, and presses the outer surfaces of the arc-shaped parts 122 of the multiple external terminal contacts 12 against the first conductive parts 11. In this way, the multiple external terminal contacts 12 are supported on the electrical connecting apparatus 1.

When the contact part 121 of the external terminal contact 12 is pressed downwardly, the first holding part 41 is elastically deformed by being pressed by the inner surface of the support part 123 to be compressed, thereby allowing rolling of the external terminal contact 12. Further, the first holding part 41 exerts its restoring force to allow the outer surface of the external terminal contact 12 to closely contact the first conductive part 11 while biasing the contact part 121 of the external terminal contact 12 upwardly.

At this time, the contact surface of the contact part 121 at the tip of each external terminal contact 12 is curved into a projecting shape. A contact position at the contact surface is moved while the contact surface runs over (rubs) the terminal in response to the height displacement of the terminal. In this way, each contact part 121 is connected reliably and stably to each external terminal 32 of the integrated circuit 3.

The GND terminal contact unit 2 is a member for making ground connection by electrically contacting the GND terminal 31 provided on the back surface of the integrated circuit 3 housed in the electrical connecting apparatus 1. The GND terminal contact unit 2 is formed of multiple GND terminal contacts 21 as plate-like members made of metal having conductivity, for example. Each of the GND terminal contact 21 has a cantilever structure with an upper tip portion to contact the GND terminal 31 of the integrated circuit 3, and a contact surface at a lower end contacting the second conductive part 16 formed on the substrate 10.

As shown in FIG. 1, the GND terminal contact unit 2 has a configuration formed by stacking multiple plate-like GND terminal contacts 21 in the thickness directions of the GND terminal contacts 21, and arranging the GND terminal contacts 21 in a line so as to establish contact and electrical conduction between respective surfaces of adjacent ones of the GND terminal contacts 21. In the illustration of FIG. 1, eight GND terminal contacts 31 are arranged in a line while the orientation of the GND terminal contact 21 in a crosswise direction is changed alternately between adjacent ones of the GND terminal contacts 21. The multiple GND terminal contacts 21 are arranged vertical to the substrate 10 in such a manner that the respective contact surfaces of the GND terminal contacts 21 contact the second conductive part 16 on the substrate 10 from above. In this way, each GND terminal contact 21 forming the GND terminal contact unit 2 comes into contact with the second conductive part 16 and becomes electrically connected to the second conductive part 16, and becomes electrically conductive with an adjacent one of the GND terminal contacts 21.

The GND terminal contact unit 2 having the foregoing configuration has an upper contact part provided on multiple cantilever structures (in the illustration of FIG. 1, eight contact parts), and a lower contact surface formed of the respective contact surfaces of the multiple GND terminal contacts 21.

Figure 4:
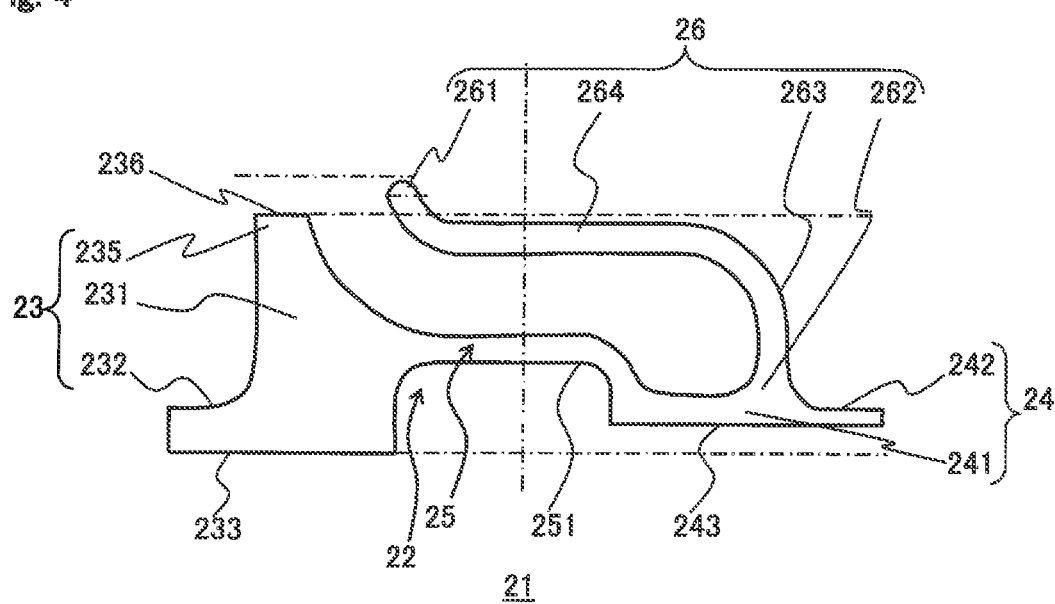
FIG. 4 is a configuration view showing the configuration of a GND terminal contact according to the first embodiment.

FIG. 4 is a front view showing the configuration of the GND terminal contact 21 according to the first embodiment. Referring to FIG. 4, the GND terminal contact 21 is a plate-like member made of a metallic material having conductivity. The GND terminal contact 21 includes: a base 22 having a contact surface 233 at a lower end (hereinafter also called a GND contact surface) contacting the second conductive part 16 on the substrate 10 and electrically connected to the second conductive part 16; and an arm 26 of a cantilever structure with one end supported by the base 22 and a tip portion 261 at an opposite end to contact the GND terminal 31 of the integrated circuit 3. The base 22 and the arm 26 are formed integrally to have the same thickness.

The base 22 includes: a first base 23 (hereinafter also called a base end) having the GND contact surface 233; a second base 24 (hereinafter also called an arm base) supporting the arm 26; and a support target 25 connecting the base end 23 and the arm base 24 in the crosswise direction and having a portion supported on the housing 13 by the second holding part 42 (see FIG. 1, FIG. 2(A), and FIG. 2(B)). The support target 25 is located at a substantially central position of the GND terminal contact 21 in the crosswise direction. The base end 23 is located on one of the right and left sides across the support target 25, and the arm base 24 is located on the other side.

As shown in FIG. 4, the base end 23 includes: a principal part 231 extending upwardly from a lower end; a first latching target 232 (hereinafter also called a base end latching target) extending externally in the crosswise direction from a lower lateral side of the principal part 231; and a stopper 235 located above the principal part 231. The horizontal GND contact surface 233 is formed at the lower end of the base end 23, specifically, at the lower end of the principal part 231 and the lower end of the base end latching target 232. A horizontal plane surface 236 (hereinafter also called a regulating surface) is formed at the upper end of the stopper 235. The GND contact surface 233 is a part contacting the second conductive part 16 on the substrate 10. The support target 25 communicates with an inner lateral side of the principal part 231.

The stopper 235 is a part to limit downward movement of the integrated circuit 3 of a predetermined amount or more by making the regulating surface 236 abut on a surface of the GND terminal 31 of the integrated circuit 3. The stopper 235 prohibits excessive downward movement of the integrated circuit 3. This further prohibits excessive downward movement of the arm 26. The stopper 235 is formed so as to be capable of withstanding load of pressing the integrated circuit 3 pressed against the stopper 235. The stopper 235 is formed so as not to interfere with the tip side of the arm 26 when the arm 26 is displaced downwardly by application of load on the tip portion 261. In the illustration of FIG. 4, the stopper 235 has an inner side recessed diagonally downwardly so as to be reduced in width as it goes upward. The regulating surface 236 is formed outside the upper end of the stopper 235.

The base end latching target 232 is a part latched by the latching part 18c formed at the inner wall surface of the hole part 18 at the housing 13 for fixing the positions or postures of the multiple GND terminal contacts 21 aligned on the substrate 10. The height and the length in the crosswise direction of the base end latching target 232 are set so as to fit the base end latching target 232 in a gap formed between the latching part 18c and the substrate 10 when the multiple aligned GND terminal contacts 21 are attached to the substrate 10 through the housing 13.

Each of the opposite surfaces of the base end 23 is to contact a surface of the arm 26 and a surface of the arm base 24 of a different and laterally reversed adjacent GND terminal contact 21 and to be electrically connected to these surfaces. The base end 23 is a part in which a conductive path is formed for connecting the tip portion 261 of the arm 26 of the different adjacent GND terminal contact 21 and the second conductive part 16 by the shortest distance.

The support target 25 is a part extending in the crosswise direction from an inner lateral side of the base end 23 to lead to the arm base 24, specifically a part located between the base end 23 and the arm base 24 and connecting the base end 23 and the arm base 24 in the crosswise direction. An upwardly recessed part 251 having a substantially rectangular shape (hereinafter also called a recess) is formed under the support target 25. The second holding part 42 for supporting the multiple GND terminal contacts 21 forming the GND terminal contact unit 2 on the housing 13 is arranged in the recess 251. As shown in FIG. 4, regarding distances from the center of the GND terminal contact 21 in the crosswise direction to the inner ends of the recess 251 on the opposite sides, the distance to the inner end adjacent to the base end 23 is longer than the distance to the inner end adjacent to the arm base 24. Thus, while the second holding part 42 is arranged in the recess 251, the inner end of the recess 251 adjacent to the arm base 24 contacts a side surface of the second holding part 42, whereas a gap is formed between the inner end of the recess 251 adjacent to the base end 23 and a side surface of the second holding part 42.

As shown in FIG. 2, the recess 251 is formed in such a manner that the upper end of the recess 251 contacts a side surface of the second holding part 42. Alternatively, a gap may be formed between the upper end of the recess 251 and the second holding part 42. This facilitates downward flection of the support target 25.

The arm base 24 is a part to support the arm 26 acting as a cantilever. As shown in FIG. 4, the arm base 24 includes a principal part 241 connecting the support target 25 and the arm 26, and a second latching target 242 (also called an arm base latching target) extending externally in the crosswise direction from a lower lateral side of the principal part 241. The principal part 241 is connected to the support target 25 at the inner side of the principal part 241, and is connected to the arm 26 at the outer side of the principal part 241. The principal part 241 has an upper end located between a portion connected to the support target 25 and a portion connected to the arm base 24. Setting the upper end of the principal part 241 at a lower height than the upper end of the support target 25 is preferable, as this allows increase in the amount of upward and downward displacement of the tip of the arm 26 (this amount will also be called a stroke amount). In the illustration of FIG. 4, the upper end of the principal part 241 is set at a lower height position than the lower end of the support target 25.

The arm base latching target 242 is a part latched by the latching part 18c formed at the inner wall surface of the hole part 18 at the housing 13 for fixing the positions or postures of the multiple GND terminal contacts 21 aligned on the substrate 10.

A horizontal bottom surface 243 is formed at the lower end of the arm base 24, specifically, at the lower end of the principal part 241 and the lower end of the second latching target 242. The bottom surface 243 of the arm base 24 is located above the GND contact surface 233 of the base end 23 by a predetermined length. By locating the bottom surface 243 of the arm base 24 at such a higher position, a gap is formed between the bottom surface 243 and the surface of the substrate 10 while the GND terminal contact 21 is attached to the substrate 10 from above. This allows downward movement of the arm base 24 even if excessive pressing load is applied to the tip portion 261 of the arm 26, for example. This reduces stress concentration to make it possible to prevent damage of the GND terminal contact 21.

The upper end of the arm base latching target 242 is placed at a height position and has a length in the crosswise direction same as those of the upper end of the base end latching target 232. Specifically, the upper end surface and the outer side edge surface of the arm base latching target 242 are bilaterally symmetric with corresponding surfaces of the base end latching target 232. The upper end surface and the outer side edge surface of the arm base latching target 242 are formed to contact the latching part 18c when the multiple aligned GND terminal contacts 21 are attached to the substrate 10 through the housing 13.

The arm 26 is a rod-like part formed to have the cantilever structure. The arm 26 has one end as a free end where the tip portion 261 to contact the GND terminal 31 of the integrated circuit 3 is provided. The arm 26 has an opposite end 262 (hereinafter also called a fixed end) connected to the arm base 24. As shown in FIG. 4, the arm 26 includes an upwardly extending portion 263 extending upwardly from the arm base 24, and a crosswise extending portion 264 extending in the crosswise direction. The tip portion 261 is provided so as to extend further upwardly than the crosswise extending portion 264. As shown in FIG. 4, the upwardly extending portion 263, the crosswise extending portion 264, and the tip portion 261 are connected to each other while being curved smoothly. The tip portion 261 has an uppermost end projecting upwardly further than the other parts of the GND terminal contact 21.

The crosswise extending portion 264 passes through the center of the GND terminal contact 21 in the crosswise direction to extend to the right and left. The tip portion 261 is located at one of the right and left sides of the crosswise extending portion 264, and the upwardly extending portion 263 is located at the other side.

The tip portion 261 is located at a position near but separated from the inner side of the stopper 235. The tip portion 261 has an uppermost end located above the height position of the regulating surface 236 of the stopper 235 by a predetermined length in order to form contact with the GND terminal 31 reliably.

The position of the tip portion 261 relative to the regulating surface 236 of the stopper 235 can be determined appropriately in consideration of pressing load, etc. For example, a height from the regulating surface 236 of the stopper 235 to the uppermost end of the tip portion 261 can be from about 0.03 to about 0.10 mm, more preferably, from about 0.05 to about 0.08 mm.

Figure 5:
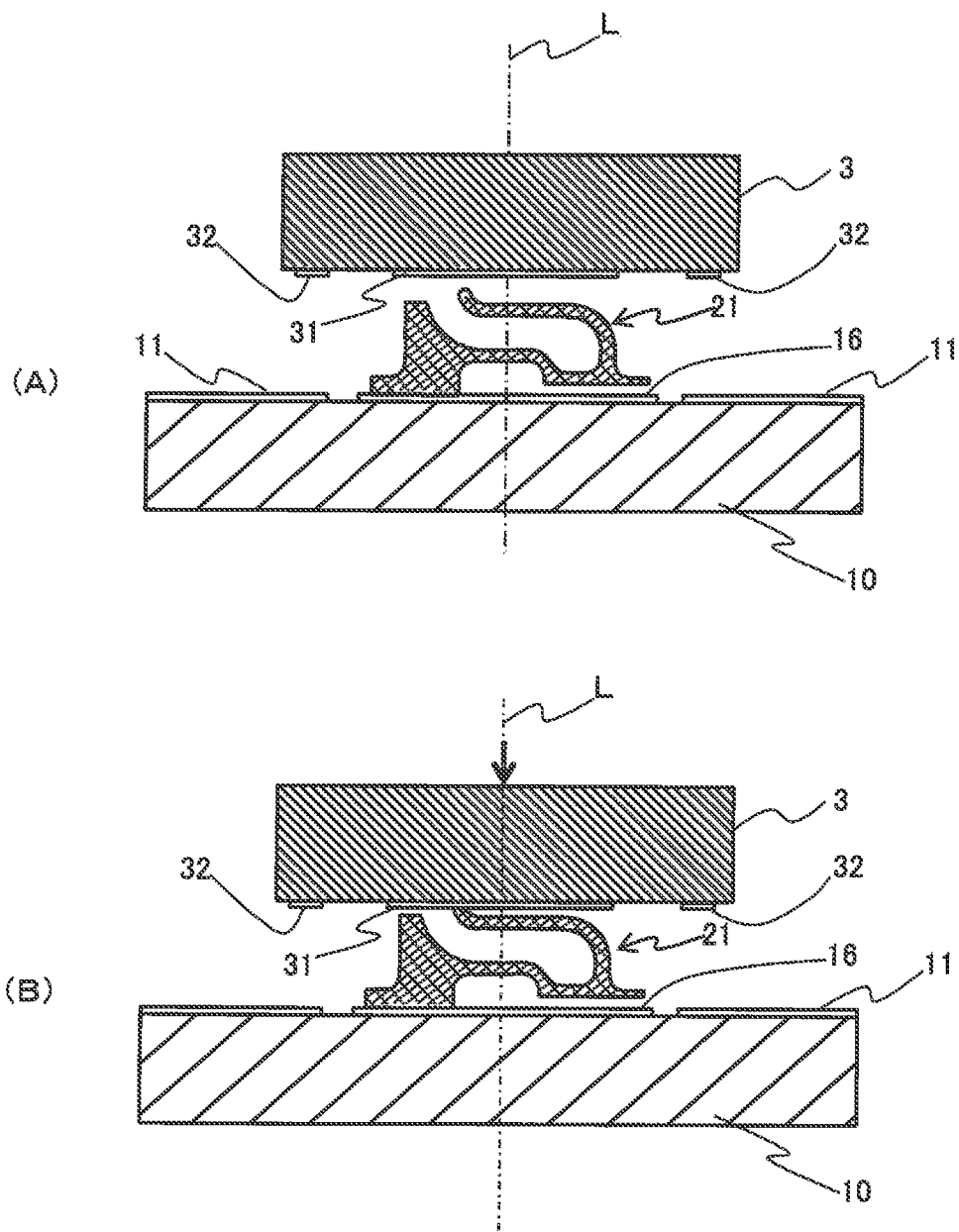
FIG. 5 is an explanatory view showing contact between a GND terminal of the integrated circuit and the GND terminal contact in the first embodiment.

Motion made by application of pressing load on the tip portion 261 of the GND terminal contact 21 according to the first embodiment will be described next by referring to FIG. 5. FIG. 5 is a schematic view showing contact between the GND terminal 31 of the integrated circuit 3 and the GND terminal contact 21 in the first embodiment. FIG. 5(A) is a schematic sectional view of the electrical connecting apparatus 1 in a state before the integrated circuit 3 is pressed against the GND terminal contact 21. FIG. 5(B) is a schematic sectional view showing a state where the integrated circuit 3 is pressed against the GND terminal contact 21. FIG. 5 shows only the substrate 10 and one GND terminal contact 21, and does not show the other constituting parts of the electrical connecting apparatus 1.

As shown in FIG. 5(A), the second conductive part 16 is formed on the surface of the substrate 10. The GND terminal contact 21 forming the GND terminal contact unit 2 is placed vertically so as to form surface contact between the GND contact surface 233 of the base end 23 and the second conductive part 16. In this state, the GND terminal contact 21 is supported by the housing 13 and the second holding part 42 not shown in FIG. 5. The integrated circuit 3 is arranged parallel to the substrate 10 in such a manner that the GND terminal 31 formed at the bottom surface of the integrated circuit 3 faces the GND terminal contact unit 2. In the illustration of FIG. 5, the integrated circuit 3 is arranged so as to locate the center of the GND terminal 31 in the crosswise direction on a center line L of the GND terminal contact 21 in the crosswise direction. In one GND terminal contact 21, the crosswise extending portion 264 of the arm 26 and the support target 25 of the base 22 are located on the center line L, the tip portion 261 of the arm 26 and the base end 23 are located on one of the right and left sides relative to the center line L, and the upwardly extending portion 263 of the arm 26 and the arm base 24 are located on the other side.

If the integrated circuit 3 in this state is pressed vertically against the substrate 10 as shown in FIG. 5(B), the GND terminal 31 of the integrated circuit 3 comes into contact with the tip portion 261 of the arm 26. Then, the pressing load acts on the arm 26 to cause the arm 26 to flex downwardly, thereby moving the tip portion 261 downwardly in an arc-like pattern. Specifically, the tip portion 261 moves upwardly and downwardly (upward and downward motion) and moves to the right and left (rightward and leftward motion). In this way, a surface of the GND terminal 31 is scrubbed with the tip portion 261. Thus, even if applied pressing load is relatively low at a level of about 0.5 kgf or less, for example, a foreign matter, an oxide coating film, etc. adhering to the abutting surface of the GND terminal 31 can be scrubbed off. Thus, the GND terminal contact 21 and the GND terminal 31 can electrically be connected to each other reliably.

As shown in FIG. 5(B), while the integrated circuit 3 is pressed against the GND terminal contact unit 2, the integrated circuit 3 does not contact the regulating surface 236 of the stopper 235 but it is held above the regulating surface 236. Even if the integrated circuit 3 is pressed downwardly further, the GND terminal 31 of the integrated circuit 3 contacts the stopper 235 to restrict the downward movement of the integrated circuit 3. Thus, excessive pressing of the tip portion 261 can be prevented. The integrated circuit 3 may be pressed until the integrated circuit 3 contacts the stopper 235, and held and subjected to a test in this state. In this case, the stopper 235 can also function as a part to be electrically connected to the GND terminal 31 of the integrated circuit 3.

Figure 6:
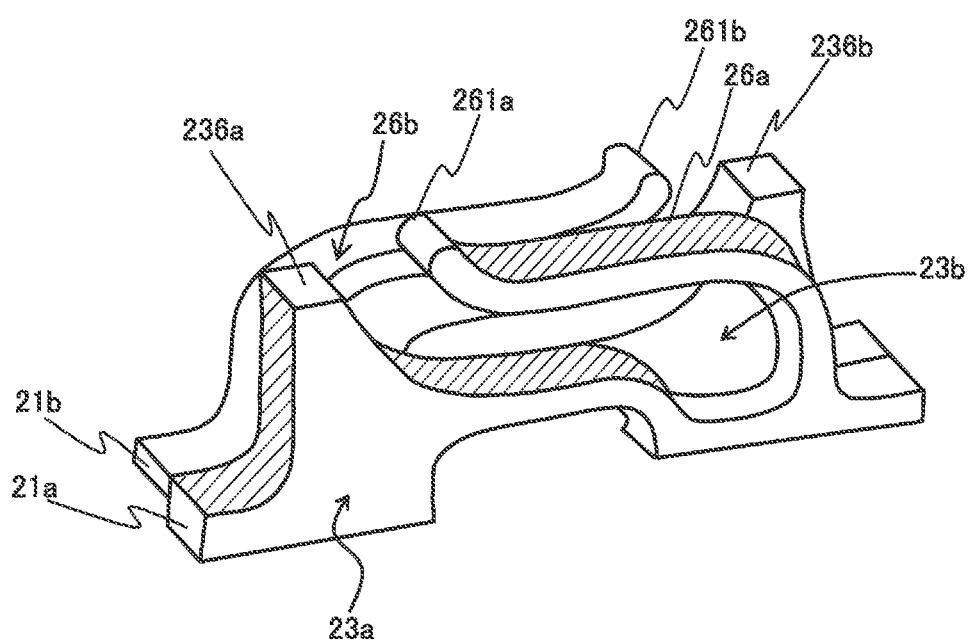
FIG. 6 is a perspective view showing arrangement of multiple GND terminal contacts in the first embodiment.
Figure 7:
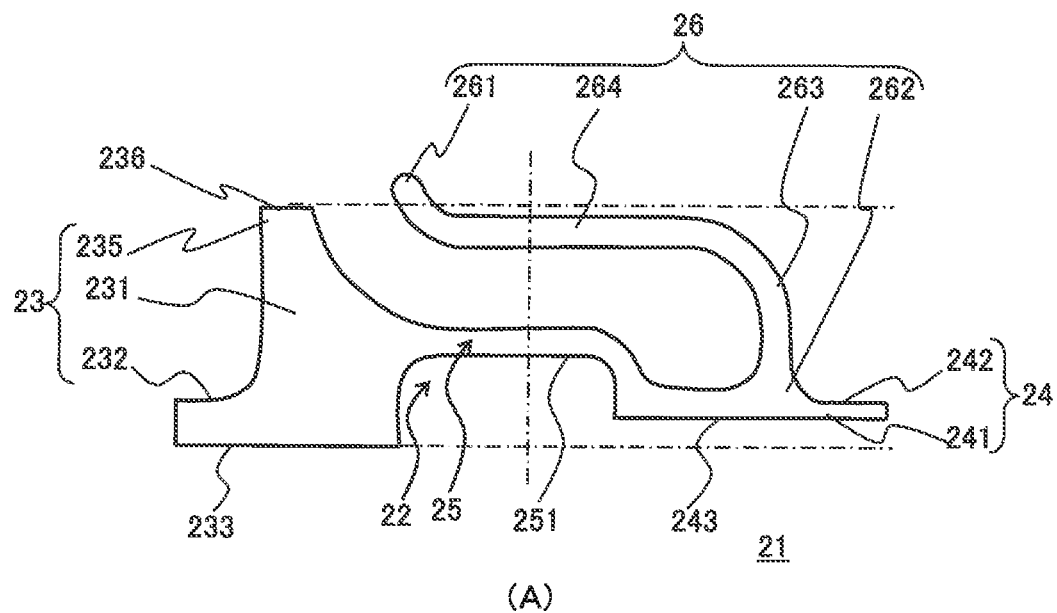
FIG. 7 includes a front view showing the configuration of the GND terminal contact according to the first embodiment, and a front view showing a configuration formed by arranging the GND terminal contacts alternately.
Figure 7:
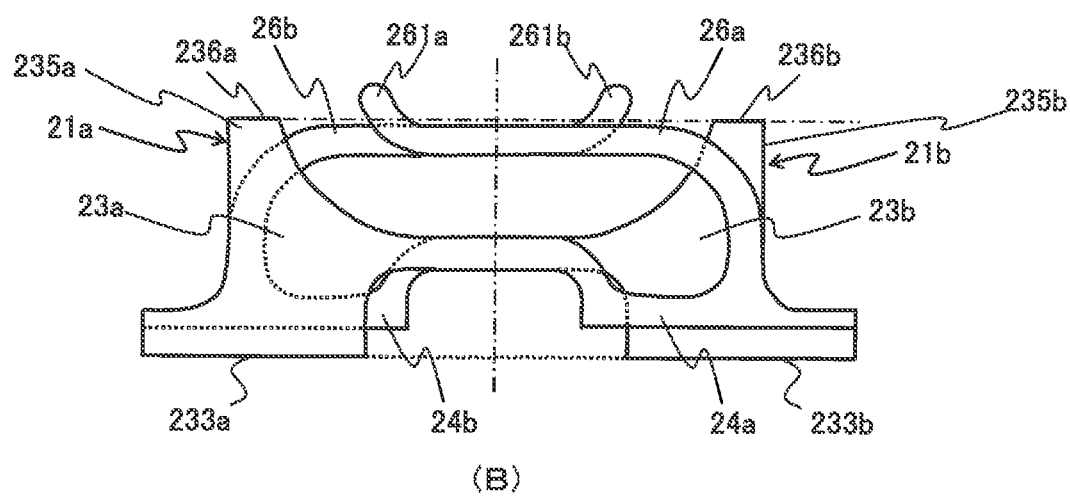

Arrangement of the multiple GND terminal contacts 21 will be described next. FIG. 6 and FIG. 7 are views for showing arrangement of the multiple GND terminal contacts 21 in the first embodiment. FIG. 6 is a perspective view of the GND terminal contacts 21 arranged adjacent to each other. FIG. 7(A) is a front view of one GND terminal contact 21. FIG. 7(B) is a front view of the two GND terminal contacts 21 arranged adjacent to each other.

In FIG. 6 and FIG. 7(B), to facilitate description, arrangement of two GND terminal contacts 21a and 21b is shown. The number of the GND terminal contacts 21 forming the GND terminal contact unit 2 is not particular limited but the number of the GND terminal contacts 21 is determined appropriately in terms of a relationship between the dimension of the GND terminal 31 of the integrated circuit 3 and the thicknesses of the GND terminal contacts 21 to be aligned. As illustrated in FIG. 6, two GND terminal contacts 21 to be adjacent to each other are preferably arranged alternately while being laterally reversed to each other. In the following description, one of the two GND terminal contacts 21 located on the front side of FIG. 6 and FIG. 7(B) will be called a first GND terminal contact 21a, and the GND terminal contact 21 located on the back side will be called a second GND terminal contact 21b. Regarding the constituting parts of the GND terminal contact 21, these constituting parts will be given the foregoing numbers and subsequent a for the first GND terminal contact 21a, and will be given the foregoing numbers and subsequent b for the second GND terminal contact 21b to distinguish between the first GND terminal contact 21a and the second GND terminal contact 21b.

As shown in FIG. 6, FIG. 7(A), and FIG. 7(B), the first GND terminal contact 21a and the second GND terminal contact 21b adjacent to the first GND terminal contact 21a have the same shape, and are stacked in positions laterally reversed to each other so as to form abutting contact between opposing surfaces. The two GND terminal contacts 21a and 21b are aligned at their right and left ends, specifically, at the outer end surface of a first latching target 232a and that of a second latching target 242b, and at the outer end surface of a first latching target 232b and that of a second latching target 242a. Further, the respective lower ends of the two GND terminals 21a and 21b, specifically, a GND contact surface 233a and a GND contact surface 233b are aligned on the same plane. As a result of this arrangement, the tip side of an arm 26a and the tip side of an arm 26b adjacent to each other come into contact at surfaces opposing each other. Further, the rear end side of the arm 26a and an arm base 24a, and the rear end side of the arm 26b and an arm base 24b, come into contact with each other at opposing surfaces of a base end 23a and a base end 23b adjacent to each other. In this way, the adjacent GND terminal contacts 21a and 21b become conductive. FIG. 6, FIG. 7(A), and FIG. 7(B) show adjacent arrangement of the two GND terminal contacts 21a and 21b. If three or more GND terminal contacts 21 are to be arranged adjacent to each other, these GND terminal contacts 21 are preferably arranged while being laterally reversed alternately. Such arrangement in which two or more GND terminal contacts are arranged adjacent to each other while being laterally reversed alternately will also be called alternate arrangement.

Figure 8:
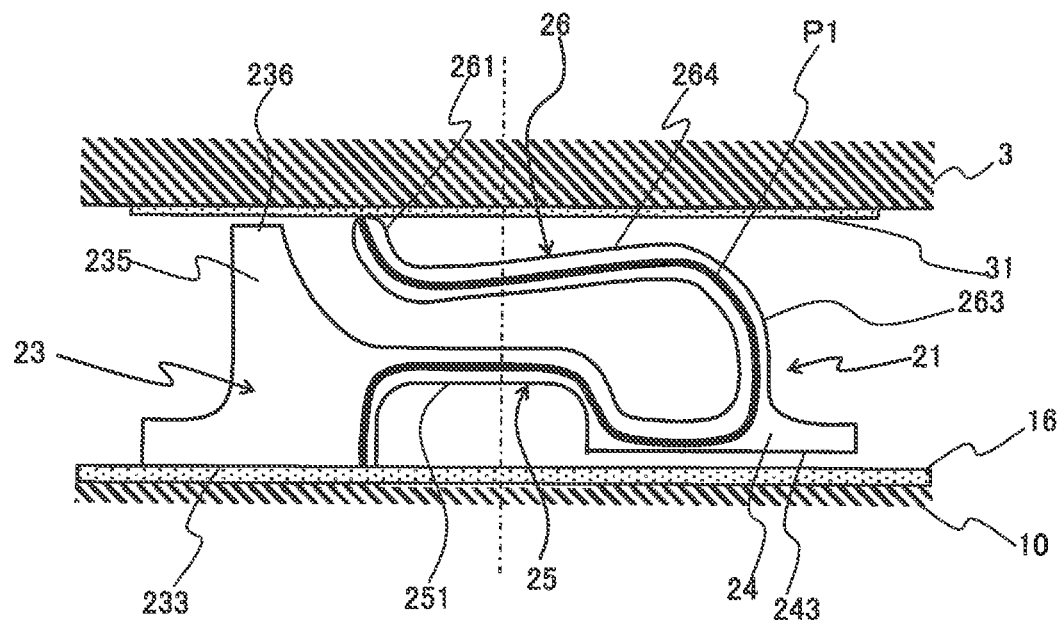
FIG. 8 is a conceptual view showing a conductive path formed by using the GND terminal contact of the first embodiment alone.
Figure 9:
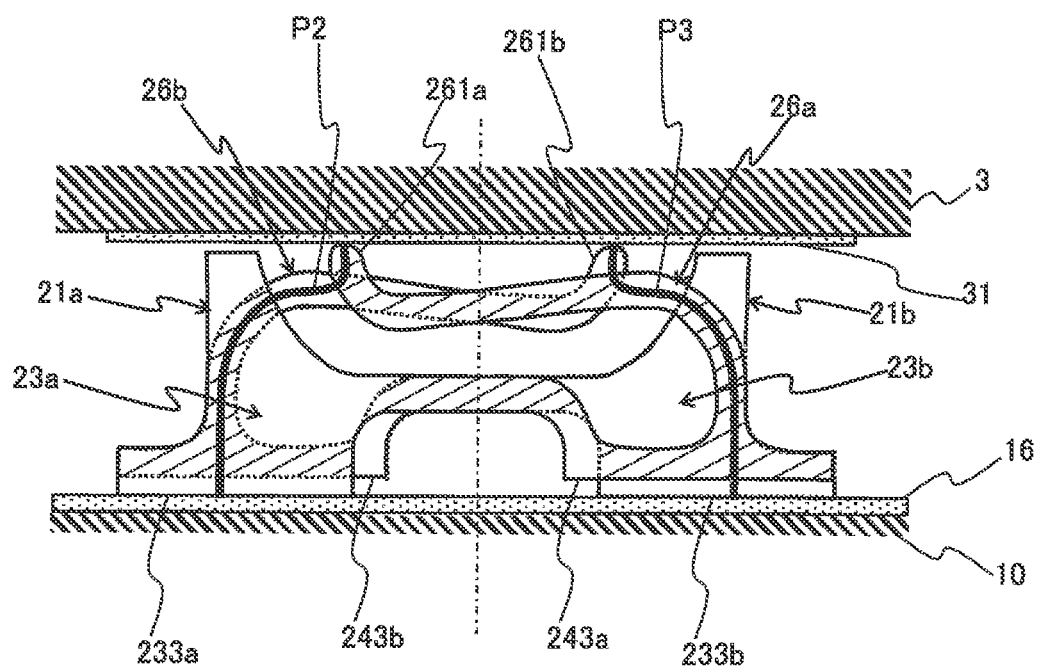
FIG. 9 is a conceptual view showing a conductive path formed by arranging the GND terminal contacts of the first embodiment alternately.

Shortening of a conductive path (in the below, a path for ground connection will also be called a ground path) achieved by the alternate arrangement of the multiple GND terminal contacts 21 will be described next. FIG. 8 and FIG. 9 are conceptual views each showing a conductive path in the GND terminal contact unit 2 in the first embodiment. FIG. 8 shows a conductive path formed by using the GND terminal contact 21 alone. FIG. 9 shows a conductive path formed by arranging two GND terminal contacts 21 adjacent to each other while laterally reversing these GND terminal contacts 21.

Referring to FIG. 8 and FIG. 9, hatch lines are given to sections where opposing surfaces contact each other. Sections with bold lines show conductive paths conceptually. (These indications are also applied to FIG. 11, FIG. 12, and FIG. 15). The conductive path mentioned herein means a path connecting the integrated circuit 3 and the second conductive part 16 by the shortest distance. In FIG. 8 and FIG. 9, the structures of the electrical connecting apparatus 1 other than the GND terminal contact 21 and the substrate 10 are omitted to facilitate description.

FIG. 8 is a schematic front view showing a state where the integrated circuit 3 is pressed against one GND terminal contact 21 supported on the substrate 10. As shown in FIG. 8, if the GND terminal contact 21 is used alone, a conductive path P1 connecting the GND terminal 31 and the second conductive part 16 starts from the tip portion 261 of the arm 26, and passes through the crosswise extending portion 264, the upwardly extending portion 263, the arm base 24, the support target 25, and the base end 23 sequentially. Having the cantilever structure of the GND terminal contact 21, the GND terminal contact 21 has a section extending in the crosswise direction in the conductive path P1 to increase the length of the path.

FIG. 9 is a front view showing a state where the two GND terminal contacts 21a and 21b arranged alternately shown in FIG. 6, FIG. 7(A), and FIG. 7(B) are supported on the substrate 10, and are pressed by the integrated circuit 3.

The two GND terminal contacts 21a and 21b arranged alternately become electrically conductive with each other in a front-to-back direction at sections opposing and contacting each other (sections with hatch lines in FIG. 9 and will also be called adjacent sections). Thus, regarding a conductive path P2 in FIG. 9 to pass through a tip portion 261a of the first GND terminal contact 21a on the front side, the conductive path P2 starts from the tip portion 261a, and then passes through an adjacent section and the rear end side of the arm 26b of the second GND terminal contact 21b. In a section where the base end 23a of the first GND terminal contact 21a and the arm 26b or the arm base 24b of the second GND terminal contact 21b are adjacent to each other, the conductive path P2 passes through both the base end 23a and the arm 26b or the arm base 24b, or either the base end 23a or the arm 26b or the arm base 24b. Then, the conductive path P2 passes a lower part of the base end 23a of the first GND terminal contact 21a not contacting the second GND terminal contact 21b to reach the second conductive part 16. Regarding a conductive path P3 to pass through a tip portion 261b of the second GND terminal contact 21b, the conductive path P3 starts from the tip portion 261b, and then passes through an adjacent section and the rear end side of the arm 26a of the first GND terminal contact 21a. In a section where the base end 23b of the second GND terminal contact 21b and the arm 26a or the arm base 24a of the first GND terminal contact 21a are adjacent to each other, the conductive path P3 passes through both the base end 23b and the arm 26a or the arm base 24a, or either the base end 23b or the arm 26a or the arm base 24a. Then, the conductive path P3 passes a lower part of the base end 23b of the second GND terminal contact 21b not contacting the first GND terminal contact 21a to reach the second conductive part 16.

As described above, in each of the GND terminal contacts 21 alternately arranged shown in FIG. 9, the tip portion 261 and the base end 23 are located at positions near but separated at an interval from each other. The separated tip portion 261 and base end 23 are electrically connected through the arm 26 of the adjacent GND terminal contact 21. This prevents formation of a conductive path extending in the crosswise direction along the arm 26. Thus, the lengths of the conductive paths P2 and P3 can considerably be reduced compared to the conductive path P1, thereby achieving favorable ground characteristics.

(A-2) Modified Embodiment of First Embodiment

Figure 10:
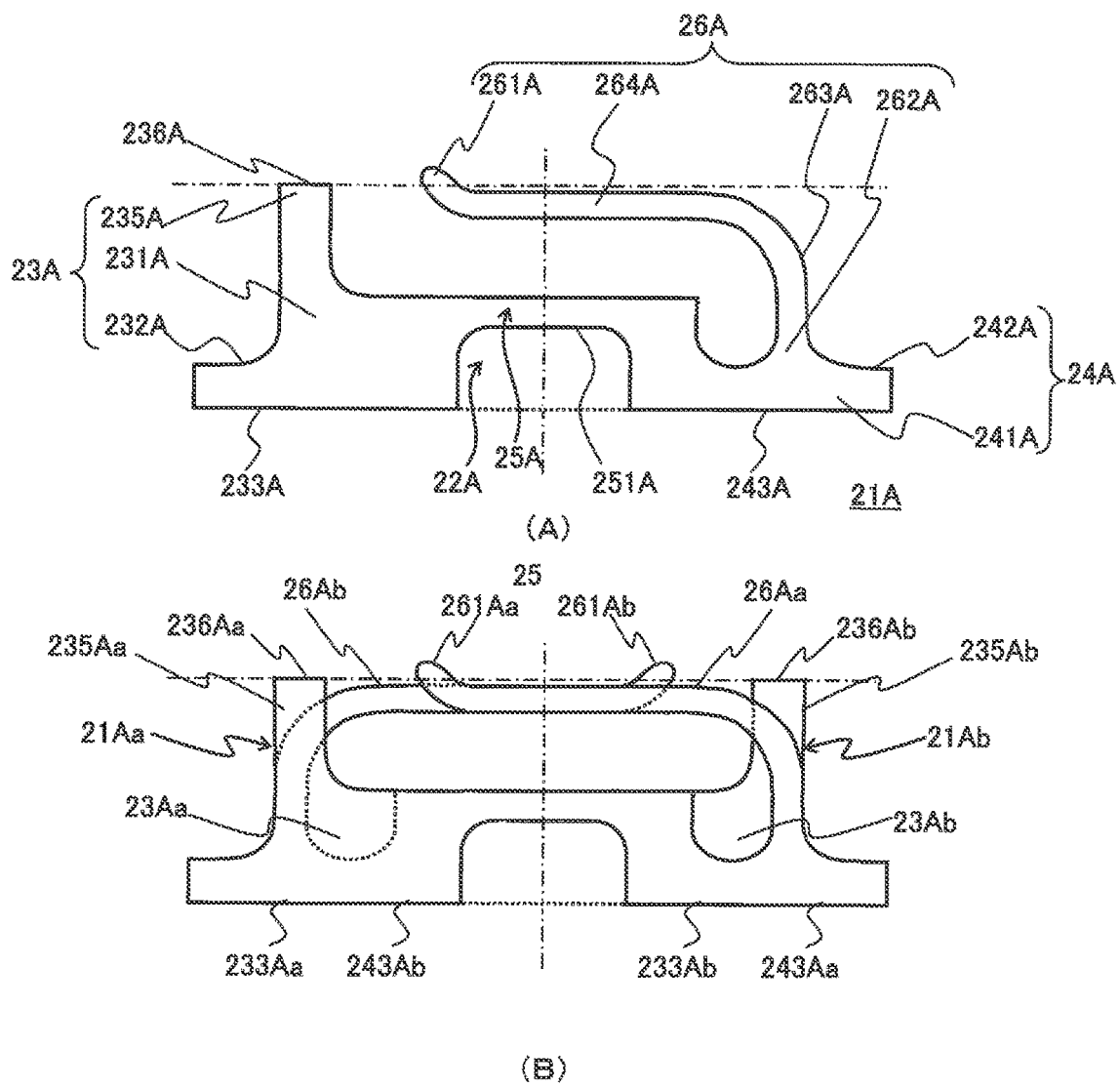
FIG. 10 includes a front view showing the configuration of a GND terminal contact according to a modified embodiment of the first embodiment, and a front view showing a configuration formed by arranging the GND terminal contacts alternately.

The configuration and arrangement of a GND terminal contact 21A according to a modified embodiment of the first embodiment will be described. FIG. 10 shows the configuration and arrangement of the GND terminal contact 21A according to the modified embodiment. FIG. 10(A) is a front view of one GND terminal contact 21A. FIG. 10(B) is a front view of the two GND terminal contacts 21A arranged adjacent to each other.

In FIG. 10(B), to facilitate description, arrangement of two GND terminal contacts 21A is shown. One of the two GND terminal contacts 21A located on the front side of FIG. 10(B) will be called a first GND terminal contact 21Aa, and the GND terminal contact 21A located on the back side will be called a second GND terminal contact 21Ab. Regarding constituting parts of the GND terminal contact 21A, these constituting parts will be given numbers and subsequent a for the first GND terminal contact 21Aa, and will be given the corresponding numbers and subsequent b for the second GND terminal contact 21Ab to distinguish between the first GND terminal contact 21Aa and the second GND terminal contact 21Ab.

As shown in FIG. 10(A), like the GND terminal contact 21 shown in FIG. 4 or FIG. 7(A), the GND terminal contact 21A of the modified embodiment includes a base 22A and an arm 26A. The base 22A includes a first base (base end) 23A, a second base (arm base) 24A, and a support target 25A. The base end 23A includes a principal part 231A, a first latching target (base end latching target) 232A, and a stopper 235A. A first GND contact surface 233A is formed at the lower end of the principal part 231A and the lower end of the base end latching target 232A. A regulating surface 236A is formed at the upper end of the stopper 235A. The support target 25A includes a recess 251A. The arm base 24A includes a principal part 241A and a second latching target (arm base latching target) 242A. The arm 26A includes a tip portion 261A, a fixed end 262A, an upwardly extending portion 263A, and a crosswise extending portion 264A.

The GND terminal contact 21A in FIG. 10(A) differs from the GND terminal contact 21 in FIG. 4 in the configurations of the arm base 24A, the stopper 235A, and the support target 25A.

The arm base 24A includes a second GND contact surface 243A formed at the lower end of the principal part 241A and the lower end of the arm base latching target 242A. The second GND contact surface 243A is a surface contacting the second conductive part 16 on the substrate 10 and electrically connected to the second conductive part 16. The second GND contact surface 243A is located at the same height position as the first GND contact surface 233A formed at the base end 23A. Thus, the first GND contact surface 233A and the second GND contact surface 243A are located on the same plane.

As shown in FIG. 10(A), the stopper 235A extends upwardly in the form of a rectangular shape from the outer upper portion of the principal part 231A of the base end 23A, and the regulating surface 236A is formed at the upper end of the stopper 235A. Regarding the GND terminal contact 21 shown in FIG. 4 or FIG. 7(A), the inner upper corner of the base end 23 is recessed while being curved into an arc-like shape to reduce the width of the stopper 235 as it goes upward. The stopper 235A of the modified embodiment differs from the stopper 235 in that the stopper 235A extends upwardly while maintaining the same width. This makes a gap from the tip portion 261A to the base end 23A located diagonally downwardly from the tip portion 261A longer than a corresponding gap in the GND terminal contact 21 shown in FIG. 4 or FIG. 7(A).

The recess 251A recessed upwardly and having a substantially rectangular shape is formed below the support target 25A. In the GND terminal contact 21 shown in FIG. 4 or FIG. 7(A), the distance from the center in the crosswise direction to the inner end of the recess 251 adjacent to the base end 23 is longer than the distance from the center to the inner end of the recess 251 adjacent to the arm base 24. The GND terminal contact 21A according to the modified embodiment differs in that these distances are equal, specifically, the recess 251A is formed to be bilaterally symmetric relative to a center line of the GND terminal contact 21A in the crosswise direction. The width of the recess 251A conforms to the width of the second holding part 42, so that the second holding part 42 can be supported more reliably.

As shown in FIG. 10(B), the first GND terminal contact 21Aa and the second GND terminal contact 21Ab adjacent to the first GND terminal contact 21Aa are stacked in positions laterally reversed to each other so as to form abutting contact between corresponding surfaces. The two GND terminal contacts 21Aa and 21Ab are aligned with each other at the outer end surface of a first latching target 232Aa and that of a second latching target 242Ab, and at the outer end surface of a first latching target 232Ab and that of a second latching target 242Aa. Further, a first GND contact surface 233Aa, a first GND contact surface 233Ab, a second GND contact surface 243Aa, and a second GND contact surface 243Ab, are aligned on the same plane. As a result of this alternate arrangement, the tip side of an arm 26Aa and the tip side of an arm 26Ab adjacent to each other come into contact at surfaces opposing each other. Further, the rear end side of the arm 26Aa and an arm base 24Aa, and the rear end side of the arm 26Ab and an arm base 24Ab, come into contact with each other at opposing surfaces of a base end 23Aa and a base end 23Ab adjacent to each other.

Figure 11:
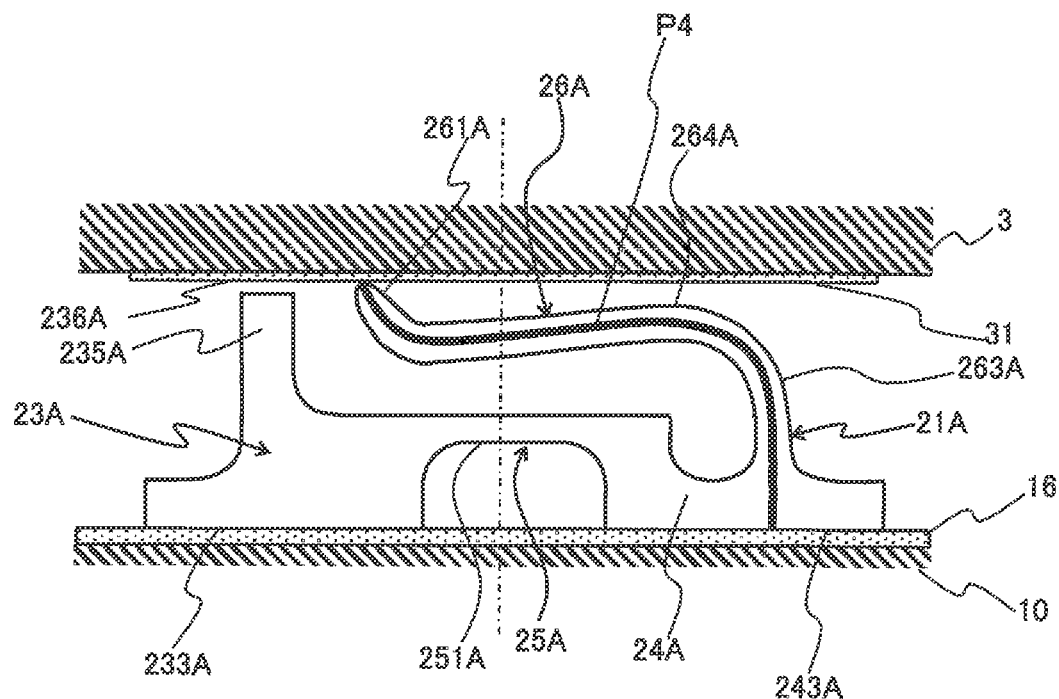
FIG. 11 is a conceptual view showing a conductive path formed by using the GND terminal contact according to the modified embodiment of the first embodiment alone.
Figure 12:
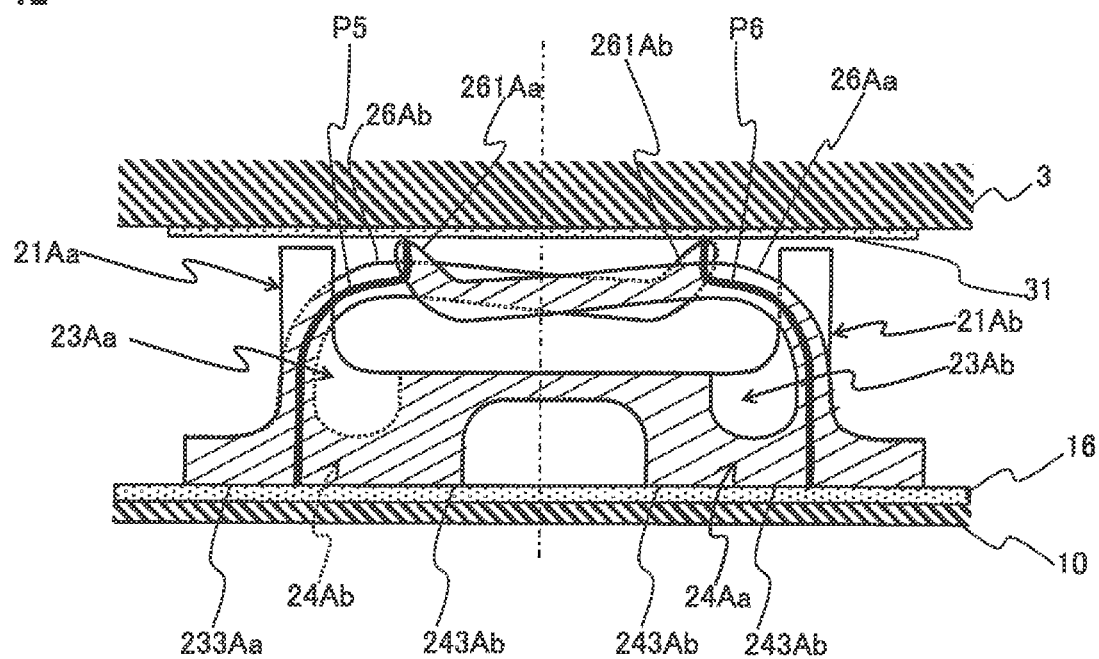
FIG. 12 is a conceptual view showing a conductive path formed by arranging the GND terminal contacts according to the modified embodiment of the first embodiment alternately.

A conductive path formed in the GND terminal contact 21A according to the modified embodiment of the first embodiment will be described next. FIG. 11 and FIG. 12 are conceptual views each showing a conductive path in the GND terminal contact 21A of the modified embodiment. FIG. 11 shows a conductive path formed by using the GND terminal contact 21A alone. FIG. 12 shows a conductive path formed by arranging two GND terminal contacts 21A adjacent to each other while laterally reversing these GND terminal contacts 21A. In FIG. 11 and FIG. 12, the structures of the electrical connecting apparatus 1 other than the GND terminal contact 21A and the substrate 10 are omitted to facilitate description.

FIG. 11 is a schematic front view showing a state where the integrated circuit 3 is pressed against one GND terminal contact 21A supported on the substrate 10. As shown in FIG. 11, if the GND terminal contact 21A is used alone, a conductive path P4 connecting the GND terminal 31 and the second conductive part 16 starts from the tip portion 261A of the arm 26A, and passes through the crosswise extending portion 264A, the upwardly extending portion 263A, and the arm base 24A sequentially. As a result of the cantilever structure of the GND terminal contact 21A, the GND terminal contact 21A produces a section extending in the crosswise direction in the conductive path P4 to increase the length of the path.

FIG. 12 is a front view showing a state where the two GND terminal contacts 21Aa and 21Ab arranged alternately shown in FIG. 10(B) are supported on the substrate 10 and are pressed by the integrated circuit 3.

The two GND terminal contacts 21Aa and 21Ab arranged alternately become electrically conductive with each other in a front-to-back direction at adjacent sections opposing and contacting each other indicated by hatch lines in FIG. 12. Thus, regarding a conductive path P5 in FIG. 12 to pass through a tip portion 261Aa of the first GND terminal contact 21Aa on the front side, the conductive path P5 starts from the tip portion 261Aa, and then passes through an adjacent section and the rear end side of the arm 26Ab of the second GND terminal contact 21Ab. In a section where the base end 23Aa of the first GND terminal contact 21Aa and the arm 26Ab or the arm base 24Ab of the second GND terminal contact 21Ab are adjacent to each other, the conductive path P5 passes through both the base end 23Aa and the arm 26Ab or the arm base 24Ab, or either the base end 23Aa or the arm 26Ab or the arm base 24Ab. Then, the conductive path P5 reaches the second conductive part 16. Regarding a conductive path P6 to pass through a tip portion 261Ab of the second GND terminal contact 21Ab, the conductive path P6 starts from the tip portion 261Ab, and then passes through an adjacent section and the rear end side of the arm 26Aa of the first GND terminal contact 21Aa. In a section where the base end 23Ab of the second GND terminal contact 21Ab and the arm 26Aa or the arm base 24Aa of the first GND terminal contact 21Aa are adjacent to each other, the conductive path P6 passes through both the base end 23Ab and the arm 26Aa or the arm base 24Aa, or either the base end 23Ab or the arm 26Aa or the arm base 24Aa. Then, the conductive path P6 reaches the second conductive part 16.

As described above, in each of the GND terminal contacts 21A alternately arranged shown in FIG. 12, the separated tip portion 261A and base end 23A are electrically connected through the arm 26A of the adjacent GND terminal contact 21A, like in the GND terminal contact 21 shown in FIG. 9. This prevents formation of a conductive path extending in the crosswise direction along the arm 26A. Thus, the lengths of the conductive paths P5 and P6 can considerably be reduced compared to the conductive path P4, thereby achieving favorable ground characteristics.

(A-3) Effect Achieved By First Embodiment

As described above, in the first embodiment, using the GND terminal contact unit in which the GND terminal contacts each having a cantilever structure are arranged alternately allows the GND terminal contact unit to electrically contact the GND terminal stably even if the integrated circuit is pressed under low load.

In the first embodiment, the GND terminal contact has a cantilever structure and allows shortening of a conductive path even with a long arm. This allows conduction of a test without causing deterioration of electrical characteristics (ground characteristics) while providing high cushioning characteristics (impact relaxing performance) to the integrated circuit being pressed.

Further, in the first embodiment, the tip portion of the arm of each GND terminal contact used for scrubbing a surface of the GND terminal. Thus, each GND terminal contact can be used by itself for cleaning a matter likely to adhere to the surface of the GND terminal. This allows the GND terminal contact unit to electrically contact the GND terminal stably while reducing the number of times cleaning is done.

Additionally, in the first embodiment, each GND terminal contact includes the stopper. Thus, downward movement of the integrated circuit to be pressed can be limited to prevent an excessive amount of stroke of the arm.

Further, in the first embodiment, the GND terminal contacts are arranged alternately while one GND terminal contact abuts on an adjacent GND terminal contact. This realizes reduction in the length of a GND path, making it possible to achieve favorable ground characteristics.

(B) Second Embodiment

A second embodiment of an electrical connecting apparatus and a contact according to the present invention will be described below by referring to the drawings.

(B-1) Configuration of Second Embodiment

The second embodiment is characterized in the configurations of multiple plate-like members forming the GND terminal contact unit 2 and the arrangement of these plate-like members.

The multiple plate-like members forming the GND terminal contact unit 2 may include a GND terminal contact 21 (or GND terminal contact 21A) same as that or corresponding to that in the first embodiment. The other plate-like member includes a plate-like member 51 (hereinafter also called a conductive plate) to contact a surface of an adjacent GND terminal contact 21, to contact the second conductive part 16, and does not have a cantilever structure for making contact with a GND terminal of an integrated circuit.

Figure 13:
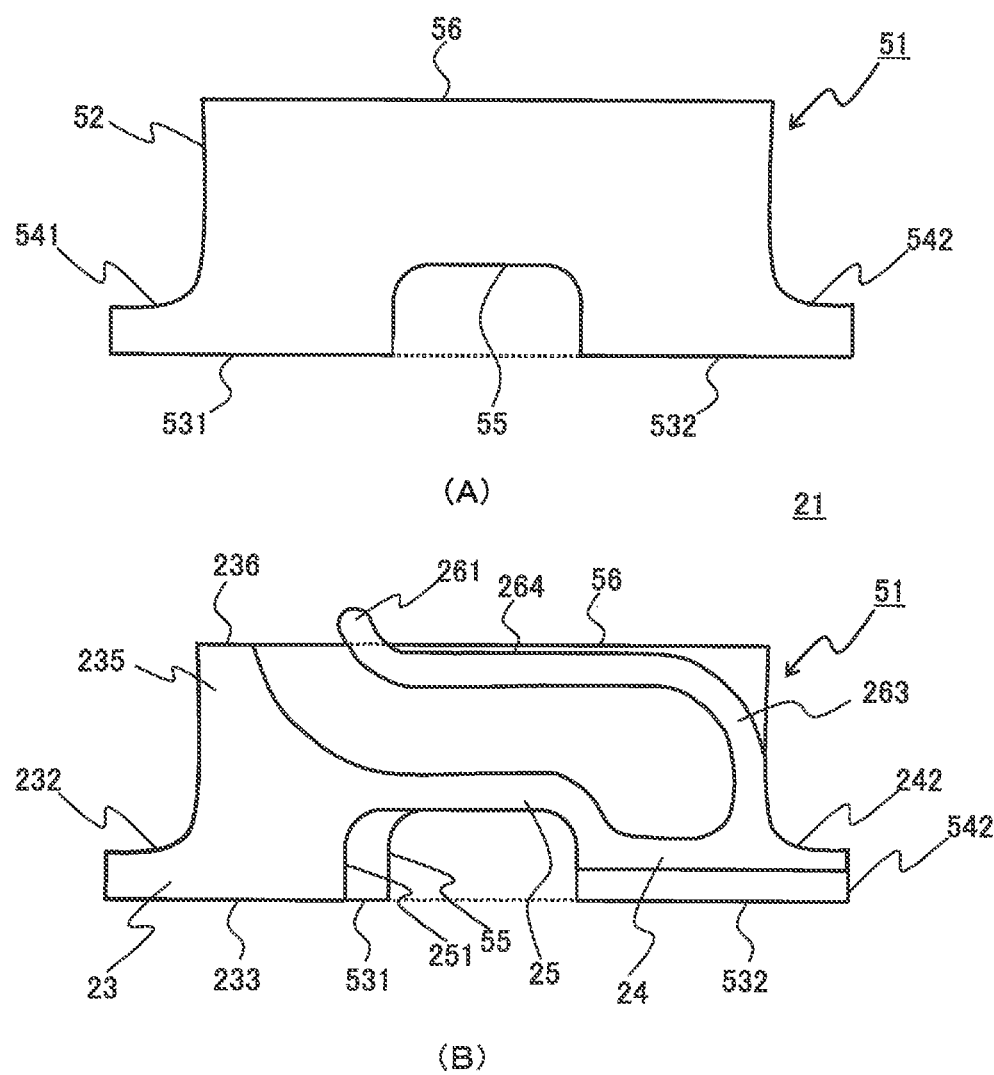
FIG. 13 includes a front view showing the configuration of a conductive plate according to a second embodiment, and a front view showing a configuration formed by arranging the conductive plates alternately.
Figure 14:
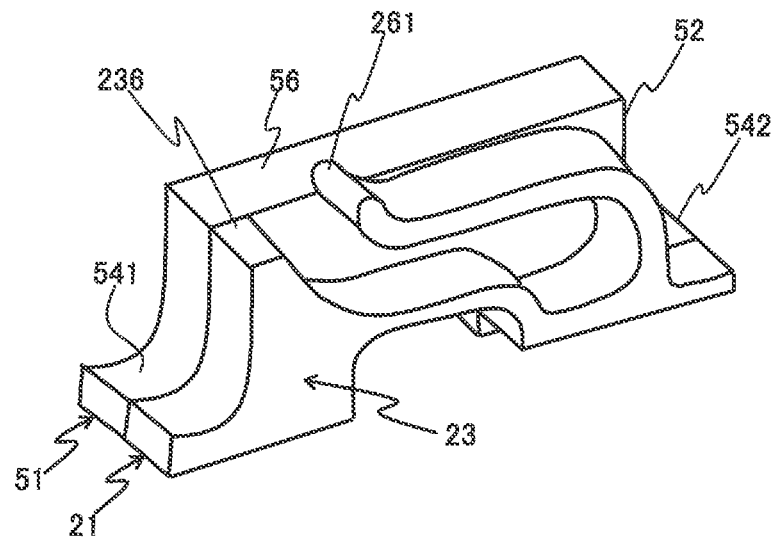
FIG. 14 is a perspective view showing arrangement of a GND terminal contact and the conductive plate according to the second embodiment.

The configuration and arrangement of the conductive plate according to the second embodiment will be described using FIG. 13 and FIG. 14. FIG. 13(A) is a front view of the conductive plate 51 according to the second embodiment. FIG. 13(B) is a front view showing a state where the conductive plate 51 is arranged adjacent to the GND terminal contact 21 of the first embodiment. FIG. 14 is a perspective view of FIG. 13(B).

In the example described in the first embodiment, the GND terminal contacts 21 are arranged adjacent to each other. By contrast, in the second embodiment, the conductive plate 51 is arranged adjacent to the GND terminal contact 21 so as to abut on the GND terminal contact 21, as shown in FIG. 13(A) and FIG. 13(B).

The conductive plate 51 is a plate-like member made of a metallic material having conductivity and formed integrally to have the same thickness. A recess 55 for supporting the conductive plate 51 on the housing 13 is formed at a substantially central position of the lower end of the conductive plate 51 in the crosswise direction. The recess 55 is a part recessed upwardly into a substantially rectangular shape from the center of the lower end of the conductive plate 51. The recess 55 receives the second holding part 42 fitted therein. The conductive plate 51 has a GND contact surface formed at the lower end thereof contacting the second conductive part 16 on the substrate 10 and electrically connected to the second conductive part 16. The GND contact surface includes a first GND contact surface 531 located on one of the right and left sides across the recess 55, and a second GND contact surface 532 on the other side.

As shown in FIG. 13(A), the conductive plate 51 includes a principal part 52 extending upwardly from a lower end of the conductive plate 51, and a latching target 541 and a latching target 542 extending externally in the crosswise direction from opposite lower lateral sides of the principal part 52. The latching targets 541 and 542 are parts latched by the latching part 18c provided at the housing 13 for fixing the position or posture of the conductive plate 51 forming the GND terminal contact unit 2. The latching targets 541 and 542 include a first latching target 541 formed on one of the right and left lower outer sides of the principal part 52, and a second latching target 542 formed on the other side. The first GND contact surface 531 is formed of a surface of the lower end of the first latching target 541 and a surface of the lower end of the principal part 52 adjacent to the first latching target 541. The second GND contact surface 532 is formed of a surface of the lower end of the second latching target 542 and a surface of the lower end of the principal part 52 adjacent to the second latching target 542. The conductive plate 51 is formed to be bilaterally symmetric relative to a center line of the conductive plate 51 in the crosswise direction.

A regulating surface 56 formed of a horizontal plane is provided at the upper end of the principal part 52. The regulating surface 56 is to abut on the GND terminal 31 if the integrated circuit 3 is pressed excessively against the GND terminal contact unit 2, thereby limiting downward movement of the integrated circuit 3.

In the conductive plate 51 shown in FIG. 14, the regulating surface 56 is formed on the entire upper end of the principal part 52 and is allowed to abut on the GND terminal 31 entirely. The regulating surface 56 is set at the same height as the regulating surface 236 of the stopper 235 of the GND terminal contact 21 forming the same GND terminal contact unit 2. In this way, the regulating surface 56 of the conductive plate 51 and the regulating surface 236 of the GND terminal contact 21 become capable of abutting on the GND terminal 31 together.

The following describes adjacent arrangement of the conductive plate 51 and the GND terminal contact 21 using FIG. 13(B) and FIG. 14. To facilitate description given below, one GND terminal contact and one conductive plate are arranged adjacent to each other. In FIG. 13(B) and FIG. 14, the GND terminal contact 21 is located on the front side and the conductive plate 51 is located on the back side. The GND terminal contact 21 and the conductive plate 51 are stacked and arranged so as to form abutting contact between opposing surfaces while the outer end surface of the latching target 232 of the GND terminal contact 21 and that of the latching target 541 of the conductive plate 51 are aligned with each other, the outer end surface of the latching target 242 of the GND terminal contact 21 and that of the latching target 542 of the conductive plate 51 are aligned with each other, and the GND contact surface 233 of the GND terminal contact 21 and the GND contact surfaces 531 and 532 of the conductive plate 51 are aligned with each other.

As shown in FIG. 13(B) and FIG. 14, in the GND terminal contact 21, the tip portion 261 has an uppermost end projecting upwardly further than the regulating surface 56 of the conductive plate 51. This makes a surface of the arm 26 except the projecting portion, a surface of the arm base 24, a surface of the support target 25, and a surface of the base end 23 come into contact with a surface of the conductive plate 51. The leading edge of the surface of the arm 26 contacting the surface of the conductive plate 51 is preferably located above the GND contact surface 531, as this achieves shortening of a conductive path described later.

FIG. 13(B) and FIG. 14 show adjacent arrangement of one GND terminal contact 21 and one conductive plate 51. Alternatively, three or more plate-like members including the GND terminal contact 21 and the conductive plate 51 may be arranged in a line to be adjacent to each other. In this case, the conductive plate 51 and the GND terminal contact 21 are preferably arranged alternately. In this case, multiple GND terminal contacts 21 may be oriented in the same lateral direction, or the orientations of these GND terminal contacts 21 may laterally be reversed alternately (in the below, arrangement in which multiple GND terminal contacts 21 are oriented in the same lateral direction will also be called one-sided arrangement). Like in the first embodiment, regarding the GND terminal contact unit 2 in which multiple GND terminal contacts 21 are arranged alternately, any one or two or more of these GND terminal contacts 21 may take the place of the conductive plate 51 in FIG. 13.

As described above, by the presence of the conductive plate 51 in the GND terminal contact unit 2, if the GND terminal 31 of the integrated circuit 3 abuts on the stopper 235 of the GND terminal contact 21, the regulating surface 56 of the conductive plate 51 abuts on the GND terminal 31 together. This allows the GND terminal 31 to be supported in a reinforced manner.

Figure 15:
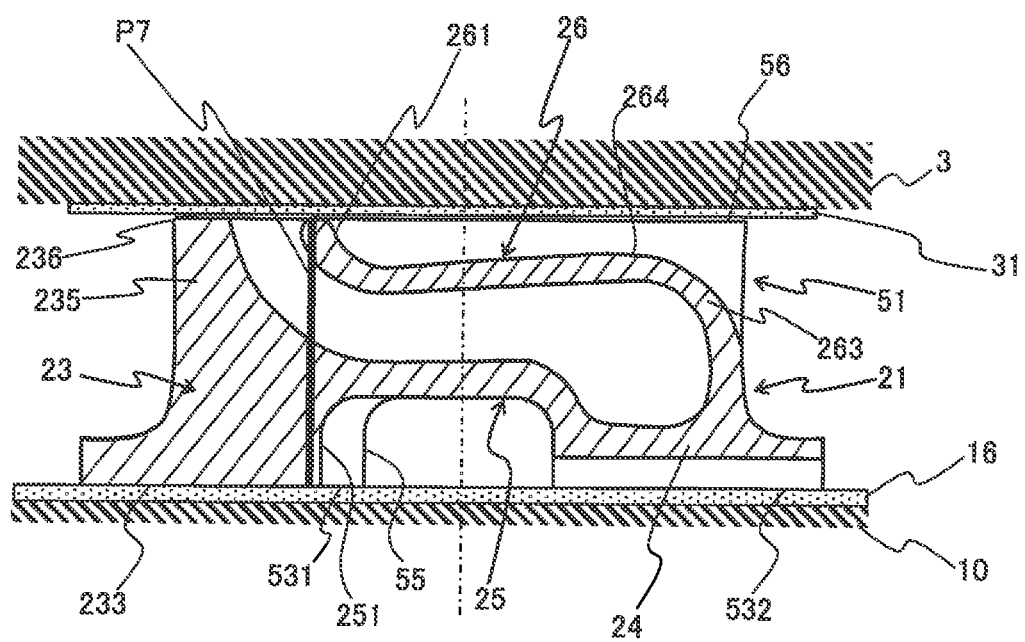
FIG. 15 is a conceptual view showing a conductive path formed by arranging the GND terminal contact and the conductive plate according to the second embodiment adjacent to each other.

Described next is a conductive path formed by arranging the conductive plate 51 adjacent to the GND terminal contact 21 shown in FIG. 4 and FIG. 7(A). FIG. 15 is a conceptual view showing a conductive path formed by arranging one conductive plate 51 and one GND terminal contact 21 adjacent to each other and is a front view showing a state where the integrated circuit 3 is pressed. In FIG. 15, the GND terminal contact 21 is located on the front side and the conductive plate 51 is located on the back side.

A conductive path P7 connecting the GND terminal 31 and the second conductive part 16 passes through the tip portion 261 of the GND terminal contact 21, moves from an adjacent section between the tip portion 261 and the conductive plate 51 to the conductive plate 51, and moves downwardly through the conductive plate 51. At a section where the base end 23 and the conductive plate 51 are adjacent to each other, the conductive path P7 passes through both the conductive plate 51 and the base end 23 or either the conductive plate 51 or the base end 23. Then, the conductive path P7 reaches the second conductive part 16.

As shown in FIG. 15, in the GND terminal contact 21, the tip portion 261 and the base end 23 are separated but electrically connected through the conductive plate 51. Thus, a conductive path to be formed does not extend in the crosswise direction along the arm 26 but it directly connects the tip portion 261 and the base end 23. As a result, the length of the conductive path P7 can considerably be reduced compared to the conductive path P1, thereby achieving favorable ground characteristics. As shown in FIG. 15, further, the GND contact surface 233 of the GND terminal contact 21 and the GND contact surface 531 of the conductive plate 51 are located vertically below the tip portion 261. This is preferable as a conductive path formed in this configuration connects the GND terminal 31 and the second conductive part 16 vertically; thereby allowing shortening of a conductive path to a greater extent.

(B-2) Modified Embodiment of Second Embodiment

Figure 16:
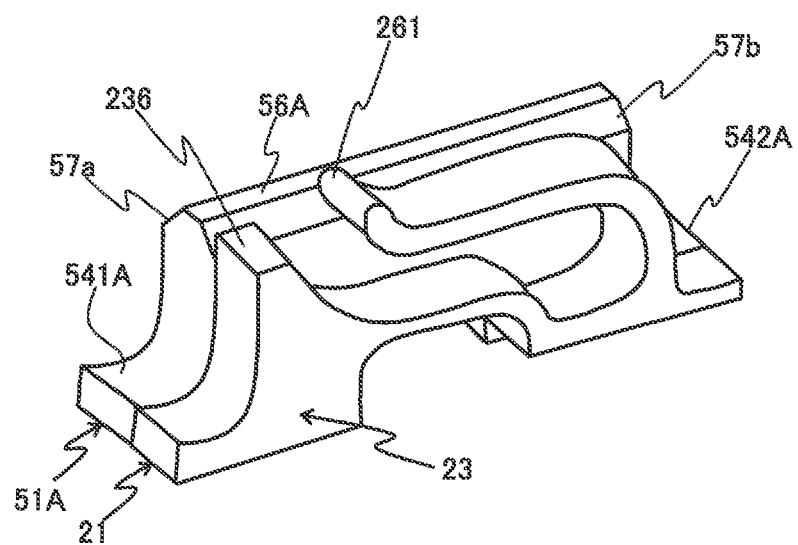
FIG. 16 is a perspective view showing arrangement of a GND terminal contact and a conductive plate according to a modified embodiment of the second embodiment (first modified embodiment).

FIG. 16 is a perspective view showing the configurations of multiple plate-like members forming the GND terminal contact unit 2 according to a modified embodiment of the second embodiment and arrangement of these plate-like members. As shown in FIG. 16, the multiple plate-like members forming the GND terminal contact unit 2 include the GND terminal contact 21 (or GND terminal contact 21A) and a conductive plate 51A. The conductive plate 51A differs from the conductive plate 51 shown in FIG. 13(A) and FIG. 14 in the shape of the upper end of the conductive plate 51A.

A regulating surface 56A having a width smaller than the thickness of the conductive plate 51A is formed at an upper end portion of the conductive plate 51A. The regulating surface 56A is a surface extending in the horizontal direction and allowing contact with the GND terminal 31 at the regulating surface 56A entirely.

Lateral sides of the regulating surface 56A in the longitudinal direction are chamfered to form a corner surface 57a and a corner surface 57b as tilted surfaces, as shown in FIG. 16. The formation of the corner surfaces 57a and 57b allows thickness reduction of the regulating surface of the conductive plate 51A. This increases contact pressure per unit area when the regulating surface contacts the GND terminal of the integrated circuit 3, achieving the effect of stabilizing the contact. Further, when the arm 26 of an adjacent GND terminal contact 21 makes upward and downward motion, the arm 26 is allowed to slide over a surface of the conductive plate 51A smoothly. Specifically, the arm 26 can be prevented from getting snagged on the conductive plate 51A during the upward and downward motion of the arm 26.

Figure 17:
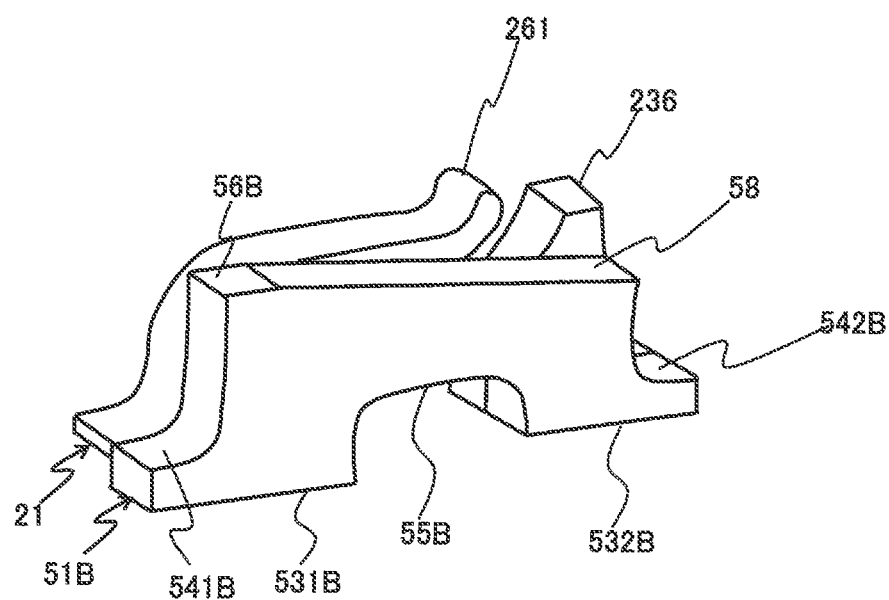
FIG. 17 is a perspective view showing arrangement of a GND terminal contact and a conductive plate according to a modified embodiment of the second embodiment (second modified embodiment).

FIG. 17 is a perspective view showing the configurations of multiple plate-like members forming the GND terminal contact unit 2 according to a different modified embodiment of the second embodiment and arrangement of these plate-like members. As shown in FIG. 17, the multiple plate-like members forming the GND terminal contact unit 2 include the GND terminal contact 21 (or GND terminal contact 21A) and a conductive plate 51B. The conductive plate 51B differs from the conductive plate 51 shown in FIG. 14 and the conductive plate 51A shown in FIG. 16 in the shape of the upper end of the conductive plate 51B.

The conductive plate 51B includes a regulating surface 56B formed at one of outer sides of the upper end of the conductive plate 51B, and a tilted surface 58 formed so as to be located at a lower position with a decreasing distance to the other side. The regulating surface 56B is set at the same height position as the regulating surface 236 of the stopper 235 of the GND terminal contact 21. The regulating surface 56B may have an area substantially equal to or larger than the area of the regulating surface 236. The presence of the tilted surface 58 at the conductive plate 51B allows the arm 26 of an adjacent GND terminal contact 21 to slide over a surface of the conductive plate 51B smoothly when the arm 26 makes upward and downward motion.

Regarding the orientation of arrangement of the conductive plate 51B, the regulating surface 56B is preferably located at a position laterally reversed to the position of the stopper 235 of an adjacent GND terminal contact 21, as this allows formation of regulating surfaces on opposite sides of the GND terminal contact unit 2.

(B-3) Effect Achieved By Second Embodiment

As described above, in addition to the effect achieved by the first embodiment, the second embodiment achieves the effect of supporting the GND terminal contact with increased strength to contact a GND pad of an integrated circuit. The second embodiment further achieves the effect of shortening a path length considerably.

(C) Other Embodiments

While the various modified embodiments of the foregoing embodiments have been described above, the present invention is further applicable to embodiments as follows.

For example, in the first and second embodiments described above, a test subject includes a large GND terminal like a pad formed at the center of the back surface of an IC package, and a contact (GND terminal contact) and an electrical correcting apparatus are used for ground connection of such a test subject. However, this does not limit the present invention but the present invention is further applicable to electrode terminals of the test subject other than a ground terminal (an electrode terminal for transmitting and receiving signals or an electrode terminal for power supply, for example). In this case, a contact surface at the lower surface of a contact unit may be configured to contact wiring patterns on a substrate responsive to such functions of the electrode terminals.

The present invention is further applicable to an electrode terminal arranged at a position other than the center of the bottom surface of an integrated circuit. In this case, the position of the hole part at the housing may be set to conform to the position of this electrode terminal.

The present invention is also applicable to a small electrode terminal like a pad. In this case, the number of plate-like members, and the orientations, widths, etc. of the plate-like members may be adjusted in such a manner that a region where multiple tip portions at an upper portion of the contact unit falls within the region of this electrode terminal.

In the description given above, the conductive plate includes the regulating surface functioning as the stopper. Alternatively, the regulating surface may be omitted from the conductive plate. In this case, the upper end of the conductive plate may be set at a lower height than a regulating surface of a contact to work in combination with the conductive plate, and the conductive plate may only have the function of forming electrical connection between a contact adjacent to the conductive plate and a wiring pattern on a substrate.

In the description given above, a test subject is a leadless IC package having external terminals provided around a GND terminal on the back surface of the test subject. However, the present invention is not limited to such external terminals but the present invention is further applicable to an IC package with lead-type or bump-type external terminals. In this case, a conventional external terminal contact suitable for such external terminals may be combined with the contact unit (GND terminal contact unit) according to the present invention.

REFERENCE SIGNS LIST

1 . . . Electrical connecting apparatus
2 . . . GND terminal contact unit
3 . . . Integrated circuit
10 . . . Substrate
11 . . . First conductive part
12 . . . External terminal contact
13 . . . Housing
14a . . . Tilted surface
14b . . . Housing wall surface 14c . . . Bottom surface
16 . . . Second conductive part
21, 21A . . . GND terminal contact
23, 23A . . . First base (base end)
232, 232A . . . First latching target
242, 242A . . . Second latching target
235, 235A . . . Stopper
24, 24A . . . Second base (arm base)
25, 25A . . . Latching target
26, 26A . . . Arm
261, 261A . . . Tip portion
51, 51A, 51B . . . Conductive plate
531, 532, 531A, 532A, 531B, 532B . . . GND contact surface
541, 541A, 541B . . . First latching target
542, 542A, 542B . . . Second latching target
57a, 57b . . . Corner surface
58 . . . Tilted surface

The invention claimed is:

1. An electrical connecting apparatus comprising a contact unit provided on a substrate to contact an electrode terminal of a test subject in response to receipt of a load and to be electrically connected to the electrode terminal, wherein
the contact unit includes multiple plate-like members having conductivity, the plate-like members are stacked in the thickness directions of the plate-like members so that opposing surfaces of adjacent stacked plate-like members touch each other, and the plate-like members are supported on the substrate in such a manner that a contact surface formed at an end surface of each of the plate-like members contacts a wiring pattern formed on the substrate,
at least some of the multiple plate-like members are contacts each including a base with the contact surface, and an arm having one end supported by the base and an opposite end where a tip portion to contact the electrode terminal of the test subject is formed,
the base has at least a part of the contact surface on one of the left and right sides of the contact, and supports one end of the arm on the other of the left and right sides of the contact,
the arm has an arm portion that extends from the other of the left and right sides to said one of the left and right sides, and a tip side of the arm portion is separated from the base on said one of the left and right sides, and
a conductive path connecting the tip portion of the arm and the wiring pattern passes from the tip portion to the wiring pattern through an adjacent plate member in contact with the arm portion, thereby shortening the conductive path from the tip portion to the wiring pattern in comparison with a conductive path that only passes through the arm of the contact without passing through the adjacent plate-like member.

2. The electrical connecting apparatus according to claim 1, wherein
the contact unit is supported on the substrate by attaching a housing to the substrate, the housing including an opening part to house the test subject, and a hole part located below the opening part and used for attaching the contact unit.

3. The electrical connecting apparatus according to claim 2, wherein
the plate-like members each include a regulating surface to regulate movement of the tip portion when the electrode terminal of the test subject abuts on the tip portion to apply the load to the tip portion.

4. The electrical connecting apparatus according to claim 3, wherein
the tip portion of the arm of each of the contacts has an upper end located above the position of the regulating surface.

5. The electrical connecting apparatus according to claim 1, wherein
the plate-like members each include a regulating surface to regulate movement of the tip portion when the electrode terminal of the test subject abuts on the tip portion to apply the load to the tip portion.

6. The electrical connecting apparatus according to claim 5, wherein
the tip portion of the arm of each of the contacts has an upper end located above the position of the regulating surface.

7. The electrical connecting apparatus according to claim 1, wherein
a recess is formed at the center of the lower end of each of the plate-like members, and
the base of each of the contacts includes a first base, and a second base connected in the crosswise direction to the first base across the recess and supporting the arm.

8. The electrical connecting apparatus according to claim 7, wherein
the first base has a lower end located at a position in a height direction same as the position of the lower end of the second base in the height direction.

9. The electrical connecting apparatus according to claim 7, wherein
the second base has a lower end located at a position in a height direction above the position of the lower end of the first base in the height direction.

10. The electrical connecting apparatus according to claim 7, wherein
the contact surface is provided at least at the first base.

11. The electrical connecting apparatus according to claim 1, wherein
the electrode terminal of the test subject is a ground terminal formed at the center of the test subject.

12. The electrical connecting apparatus according to claim 11, wherein
multiple external terminals are provided around the ground terminal of the test subject, and contacts to contact the external terminals are further provided around the contact unit.

13. An electrical connecting apparatus comprising a contact unit provided on a substrate to contact an electrode terminal of a test subject in response to receipt of a load and to be electrically connected to the electrode terminal, wherein
the contact unit includes multiple plate-like members having conductivity, the plate-like members are stacked in the thickness directions of the plate-like members, and the plate-like members are supported on the substrate in such a manner that a contact surface formed at an end surface of each of the plate-like members contacts a wiring pattern formed on the substrate,
at least some of the multiple plate-like members are contacts each including a base with the contact surface, and an arm having one end supported by the base and an opposite end where a tip portion to contact the electrode terminal of the test subject is formed,
the arm has a surface to contact a surface of an adjacent one of the plate-like members to form a conductive path connecting the tip portion and the wiring pattern through the adjacent plate-like member, the contact unit is supported on the substrate by attaching a housing to the substrate, the housing including an opening part to house the test subject, and a hole part located below the opening part and used for attaching the contact unit, the plate-like members each include latching targets formed at opposite lower lateral portions and extending externally in a crosswise direction, and the latching targets are latched by the housing.

14. The electrical connecting apparatus according to claim 13, wherein the plate-like members each include a regulating surface to regulate movement of the tip portion when the electrode terminal of the test subject abuts on the tip portion to apply the load to the tip portion.

15. The electrical connecting apparatus according to claim 14, wherein the tip portion of the arm of each of the contacts has an upper end located above the position of the regulating surface.

16. An electrical connecting apparatus comprising a contact unit provided on a substrate to contact an electrode terminal of a test subject in response to receipt of a load and to be electrically connected to the electrode terminal, wherein the contact unit includes multiple plate-like members having conductivity, the plate-like members are stacked in the thickness directions of the plate-like members, and the plate-like members are supported on the substrate in such a manner that a contact surface formed at an end surface of each of the plate-like members contacts a wiring pattern formed on the substrate, at least some of the multiple plate-like members are contacts each including a base with the contact surface, and an arm having one end supported by the base and an opposite end where a tip portion to contact the electrode terminal of the test subject is formed, the arm has a surface to contact a surface of an adjacent one of the plate-like members to form a conductive path connecting the tip portion and the wiring pattern through the adjacent plate-like member, and at least some of the plate-like members adjacent to each other are adjacent ones of the contacts laterally reversed to each other.

17. An electrical connecting apparatus comprising a contact unit provided on a substrate to contact an electrode terminal of a test subject in response to receipt of a load and to be electrically connected to the electrode terminal, wherein the contact unit includes multiple plate-like members having conductivity, the plate-like members are stacked in the thickness directions of the plate-like members, and the plate-like members are supported on the substrate in such a manner that a contact surface formed at an end surface of each of the plate-like members contacts a wiring pattern formed on the substrate, at least some of the multiple plate-like members are contacts each including a base with the contact surface, and an arm having one end supported by the base and an opposite end where a tip portion to contact the electrode terminal of the test subject is formed, the arm has a surface to contact a surface of an adjacent one of the plate-like members to form a conductive path connecting the tip portion and the wiring pattern through the adjacent plate-like member, the plate-like members except the contacts each include a conductive plate having an upper end located below the upper end of the tip portion of each of the contacts, at least some of the plate-like members adjacent to each other are one of the contacts and the conductive plate adjacent to each other, and the conductive plate has a portion for electrically connecting the tip portion and the base at separate positions of the adjacent contact.

18. A plate-like contact supported on a substrate and forming a contact unit to contact an electrode terminal of a test subject in response to receipt of load and to be electrically connected to the electrode terminal, the contact comprising:

a base with a contact surface below the base on one of the left and right sides of the contact for contacting a wiring pattern formed on the substrate, the base including a first base and a second base;

an arm having one end supported by the base and an opposite end where a tip portion to contact the electrode terminal of the test subject is formed; and a stopper positioned above the first base to regulate movement of the tip portion by contacting the test subject when the electrode terminal of the test subject abuts the tip portion and applies the load to the tip portion, wherein the second base supports the one end of the arm on the other of the left and right sides of the contact, the arm has a portion extending from the other of the left and right sides of the contact, and the opposite end of the arm where the tip portion is formed is separated from the first base on said one of the left and right sides of the contact, and a respective first said contact is stacked with at least one other said contact in a thickness direction of the stacked contacts so that opposed surfaces of adjacent stacked contacts touch each other with reversed orientations in the left and right directions, and such that the arm of the other contact is positioned to connect between the first base and the tip portion of the arm of the first contact.

* * * * *